United States Patent
Hollman et al.

(10) Patent No.: US 6,700,397 B2
(45) Date of Patent: Mar. 2, 2004

(54) TRIAXIAL PROBE ASSEMBLY

(75) Inventors: Kenneth Hollman, Carson City, NV (US); Robert Hancock, Carson City, NV (US); Daniel Smith, Minden, NV (US)

(73) Assignee: The Micromanipulator Company, Inc., Carson City, NV (US)

( * ) Notice: Subject to any disclaimer, the term of this patent is extended or adjusted under 35 U.S.C. 154(b) by 0 days.

(21) Appl. No.: 09/815,952

(22) Filed: Mar. 23, 2001

(65) Prior Publication Data

US 2002/0075027 A1 Jun. 20, 2002

Related U.S. Application Data

(63) Continuation-in-part of application No. 09/615,454, filed on Jul. 13, 2000, now Pat. No. 6,424,141.

(51) Int. Cl.[7] .............................................. G01R 1/073
(52) U.S. Cl. ......................................... 324/762; 324/765
(58) Field of Search ................................ 324/765, 754, 324/762, 758, 72.5

(56) References Cited

U.S. PATENT DOCUMENTS

| 4,884,026 A | | 11/1989 | Hayakawa et al. ...... 324/158 F |
| 4,894,612 A | * | 1/1990 | Drake et al. ................. 324/754 |
| 5,041,782 A | * | 8/1991 | Marzan ....................... 324/754 |
| 5,220,277 A | | 6/1993 | Reitinger |
| 5,266,889 A | | 11/1993 | Harwood et al. .......... 324/158 F |
| 5,309,088 A | | 5/1994 | Chen ...................... 324/158 D |
| 5,345,170 A | | 9/1994 | Schwindt et al. ........... 324/754 |
| 5,434,512 A | | 7/1995 | Schwindt et al. ........... 324/754 |
| 5,457,398 A | | 10/1995 | Schwindt et al. ........... 324/754 |
| 5,568,054 A | | 10/1996 | Iino et al. |
| 5,610,529 A | | 3/1997 | Schwindt .................... 324/760 |
| 5,835,997 A | | 11/1998 | Yassine ...................... 324/754 |
| 5,963,027 A | | 10/1999 | Peters ...................... 324/158.1 |
| 6,124,723 A | * | 9/2000 | Costello ..................... 324/762 |

FOREIGN PATENT DOCUMENTS

| JP | 63138745 | 6/1988 |
| JP | 2220453 | 9/1990 |
| JP | 7084003 | 3/1995 |

OTHER PUBLICATIONS

Koyama, R.Y. and Buehler, M.G., *Semiconductor Measurement Technology: A Wafer Chuck for Use Between –196 and 350C*, U.S. Department of Commerce, National Technical Information Service, PB–293298, National Bureau of Standards, SP 400–55, pp. 1–17 (Jan. 1979).

(List continued on next page.)

Primary Examiner—Ernest Karlsen
(74) Attorney, Agent, or Firm—Fitch, Even, Tabin & Flannery

(57) ABSTRACT

The invention relates to a probe assembly for a wafer probe station having a probe holder and a replaceable probe tip. The probe holder is triaxially configured with a laterally extending center signal conductor, an intermediate guard conductor extending along the length of the center conductor and spaced radially therefrom by a tubular insulator member, and an outer shield member extending along a portion of the guard conductor and spaced radially therefrom by a second tubular insulator member. A coaxially configured probe tip has a center conductor extending to a probe point and a guard conductor radially spaced from the center conductor by an intermediate insulator. A releasable connection provides a rigid attachment between the probe tip and the probe holder and provides electrical interfaces between the center and guard conductors thereof. The probe assembly provides a replaceable probe tip solution having a rigid design and the ability to guard the center conductor along its length to a distance very near the probe point to provide enhanced performance in low current and low voltage measurement applications.

23 Claims, 30 Drawing Sheets

OTHER PUBLICATIONS

Koyama, R.Y. and Buehler, M.G., *Novel variable–temperature chuck for use in the detection of deep levels in processed semiconductor wafers*, Review of Scientific Instruments, vol. 50, No. 8, pp. 983–987 (Aug. 1979).

*Test Station Accessories*, A1007517, The Micromanipulator Company, Inc., pp. 1–2 (1988).

*Basics of Low Current Probing*, Application Note, A1009492, The Micromanipulator Company, Inc., pp. 1–8 (1987).

Yamamoto, Yousuke, *A Compact Self–Shielding Prober for Accurate Measurement of On–Wafer Electron Devices*, IIEE Transactions on Instrumentation and Measurement, vol. 38, No. 6, pp. 1088–1093 (Dec. 1989).

*Triaxial Vacuum Chuck Theory of Operation*, Internal Product Information, A1009706, The Micromanipulator Company, Inc., pp. 1–3 (No date).

Dickson, Brian and Branst, Lee, *Wafer Probing: Femtoamp Measurements Require Attention to Details*, Test & Measurement World, pp. 37–38 and 41–42 (Jan. 1998).

Micromanipulator Company, Inc. drawing entitled *HSM Chuck Mechanical Assembly*, which depicts a Micromanipulator Company chuck assembly that was in public use or on sale prior to Jul. 13, 1999.

Micromanipulator Company, Inc. drawing entitled *HSM Chuck Cut Away View*, which depicts a Micromanipulator Company chuck assembly that was in public use or on sale prior to Jul. 13, 1999.

Micromanipulator Company, Inc. drawing entitled *Heater Element Insulation*, which depicts a Micromanipulator Company chuck assembly that was in public use or on sale prior to Jul. 13, 1999.

Micromanipulator Company, Inc. drawing entitled *HCSM Chuck Mechanical Assembly*, which depicts a Micromanipulator Company chuck assembly that was in public use or on sale prior to Jul. 13, 1999.

Micromanipulator Company, Inc. drawing entitled *HCSM Chuck Cut Away View*, which depicts a Micromanipulator Company chuck assembly that was in public use or on sale prior to Jul. 13, 1999.

Temptronics Inc., drawing entitled *Temptronics "Guarded" Chuck*, which depicts a Temptronics, Inc. chuck assembly that was in public use or on sale prior to Jul. 13, 1999.

Micromanipulator Company, Inc. drawing entitled *Chuck Mechanical Assembly*, which depicts a Micromanipulator Company chuck assembly that was in public use or on sale prior to Jul. 13, 1999.

Micromanipulator Company, Inc. drawing entitled *Chuck Cut Away View*, which depicts a Micromanipulator Company chuck assembly that was in public use or on sale prior to Jul. 13, 1999.

Micromanipulator Company, Inc. drawing entitled *Low Noise Chuck Mechanical Assembly*, which depicts a Micromanipulator Company chuck assembly that was in public use or on sale prior to Jul. 13, 1999.

Micromanipulator Company, Inc. drawing entitled *Chuck Cut Away View*, which depicts a Micromanipulator Company chuck assembly that was in public use or on sale prior to Jul. 13, 1999.

Micromanipulator Company, Inc. drawing entitled *H1000 Chuck Assembly*, which depicts a Micromanipulator Company chuck assembly that was in public use or on sale prior to Jul. 13, 1999.

Micromanipulator Company, Inc. drawing entitled *H1000 Chuck Cut Away View*, which depicts a Micromanipulator Company chuck assembly that was in public use or on sale prior to Jul. 13, 1999.

* cited by examiner

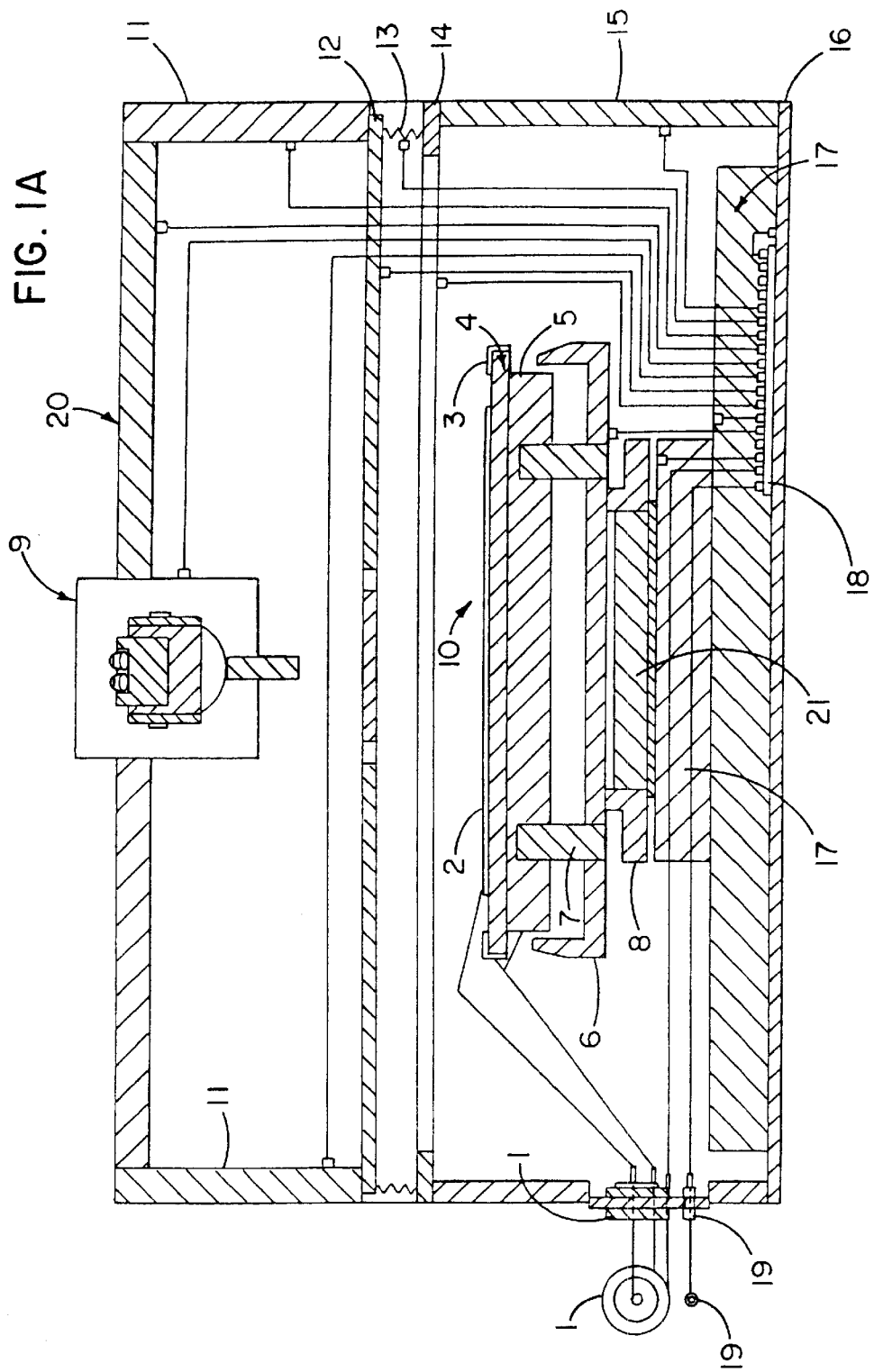

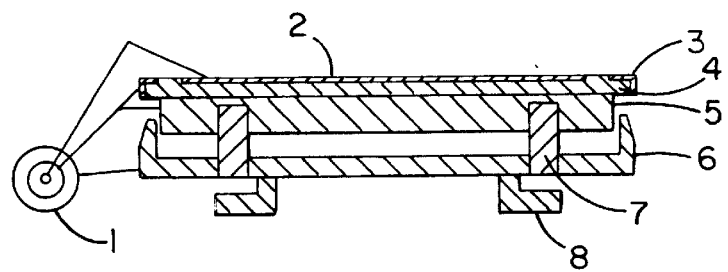
FIG. 4
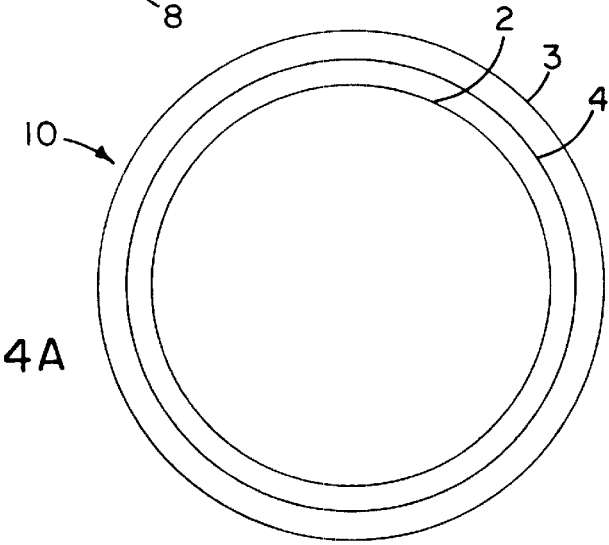
FIG. 4A
FIG. 5
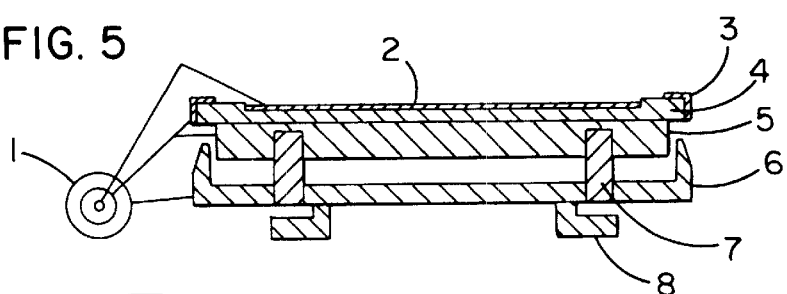
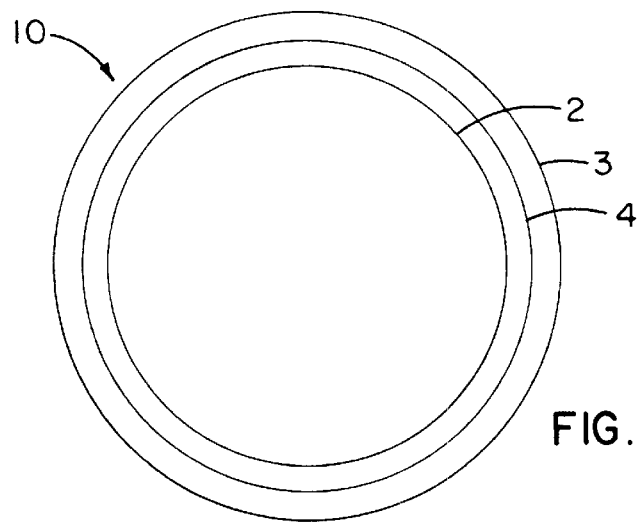
FIG. 5A

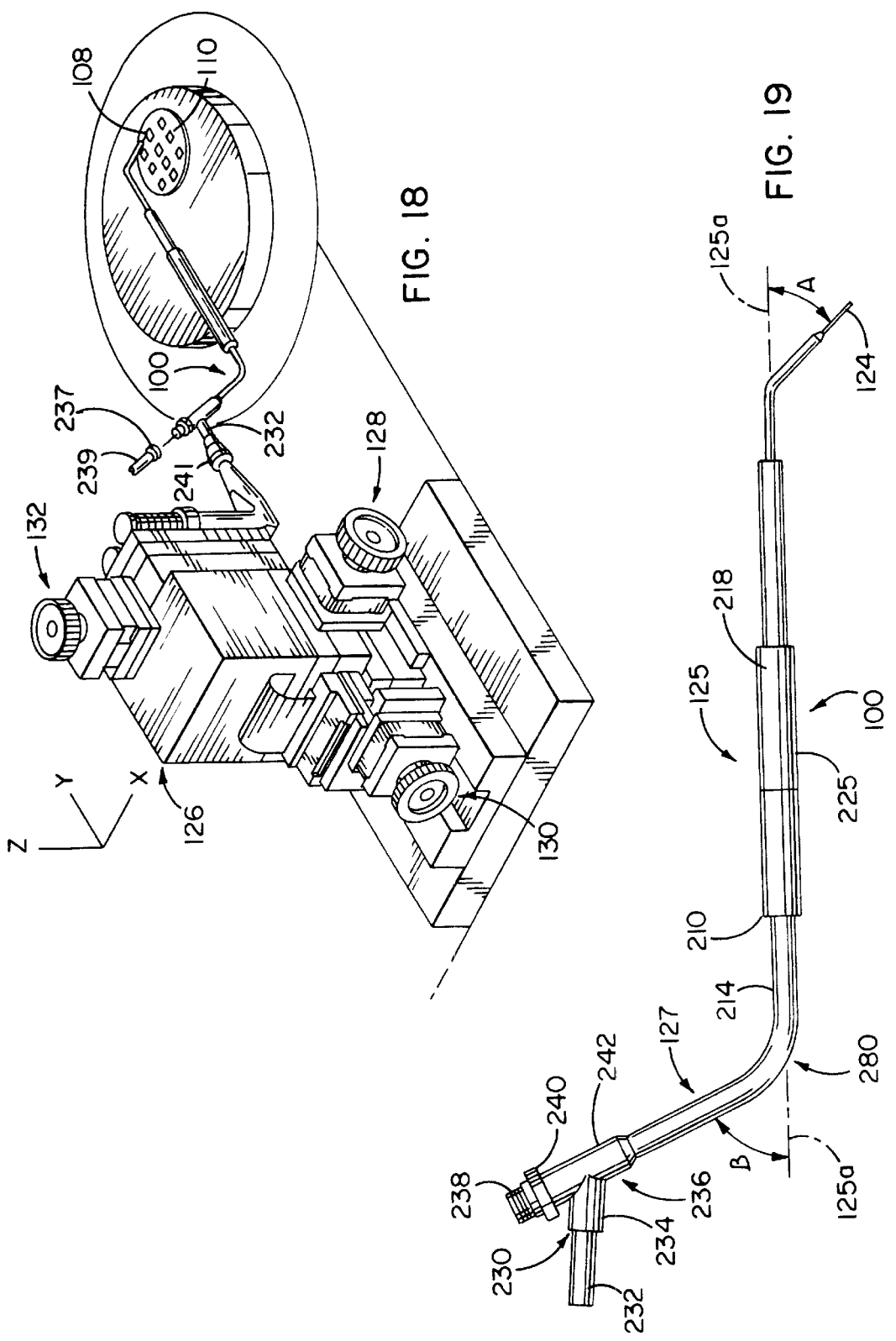

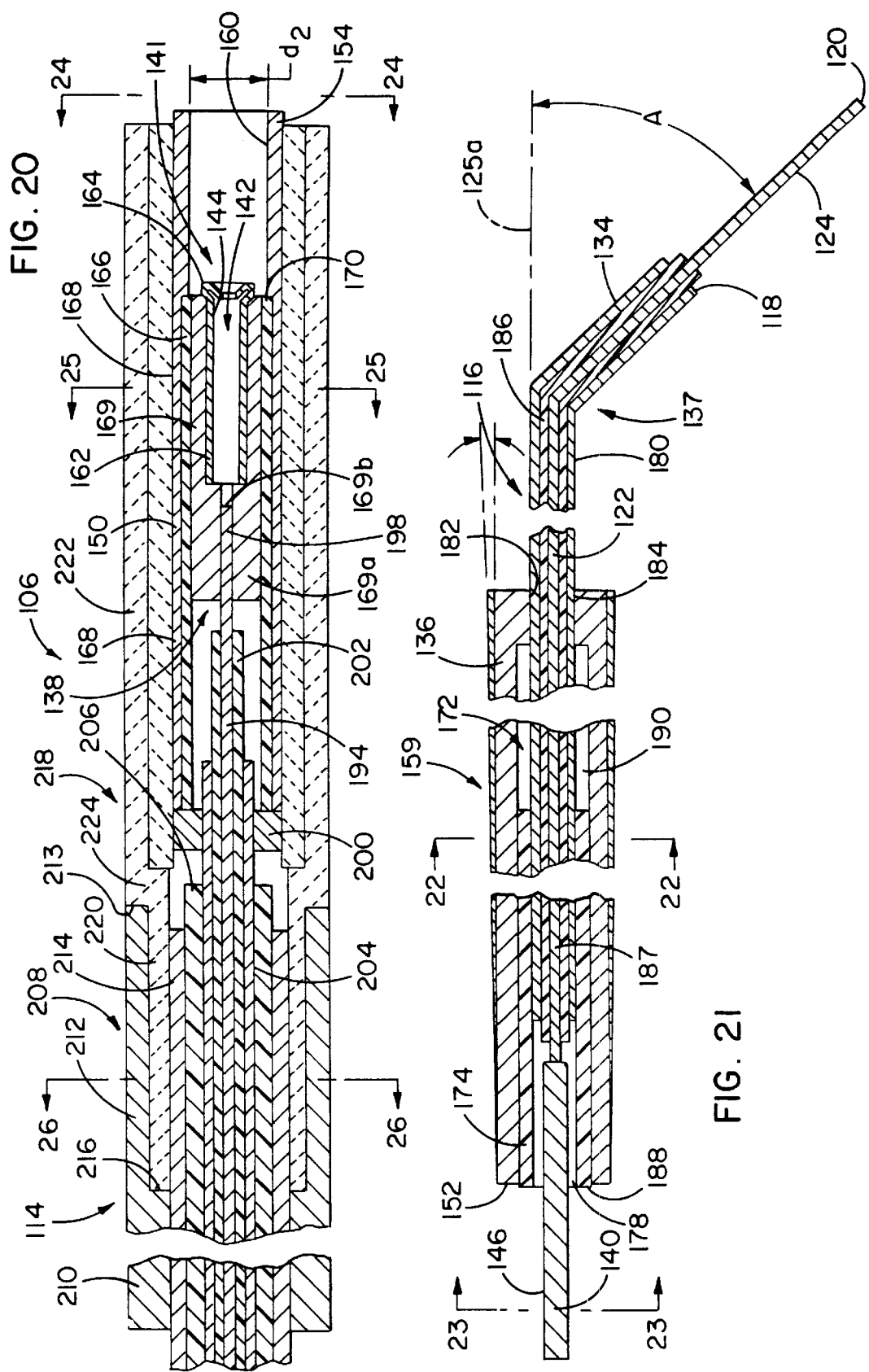

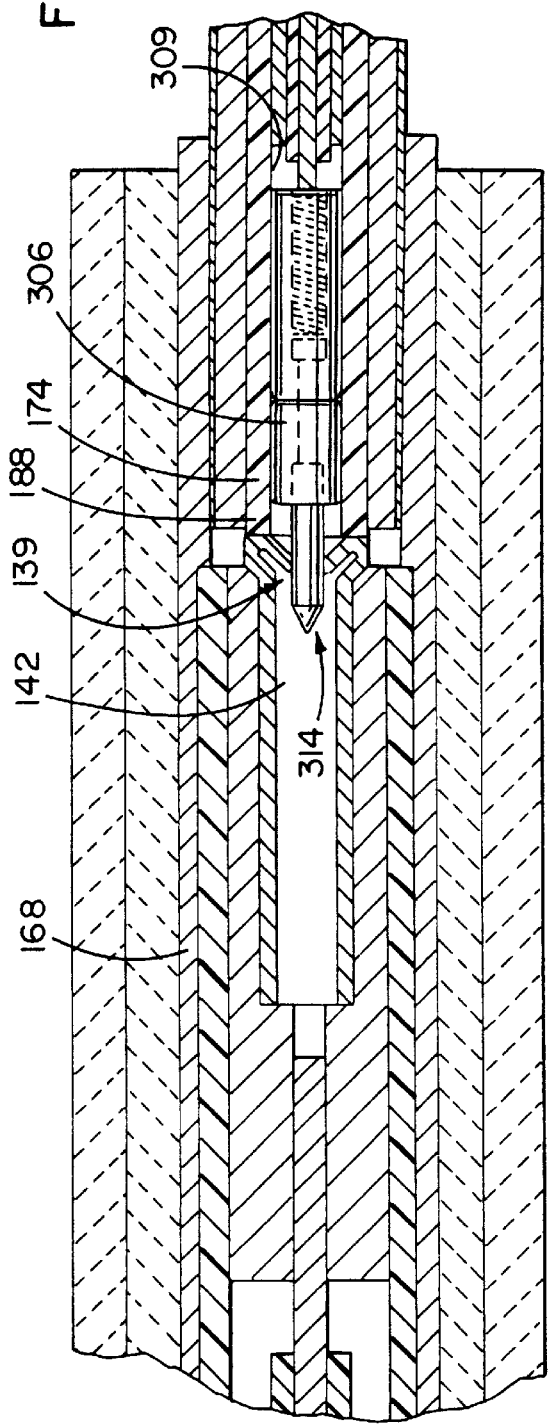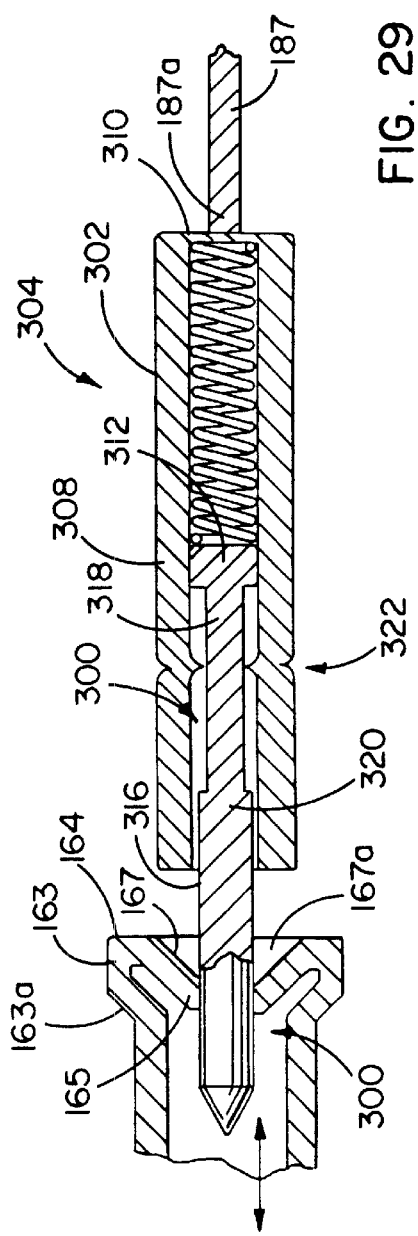

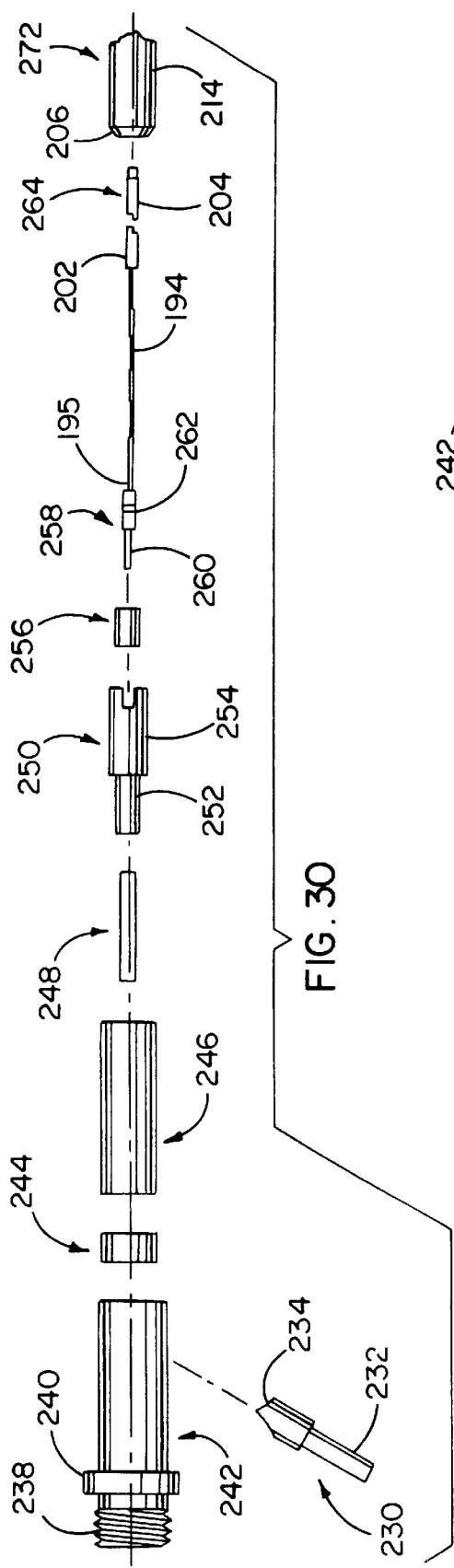
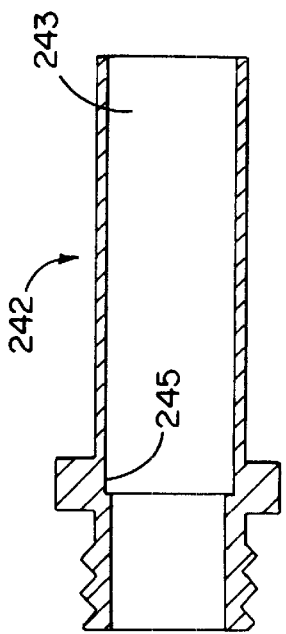
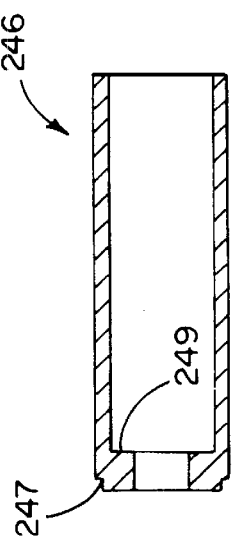
FIG. 30
FIG. 31
FIG. 32

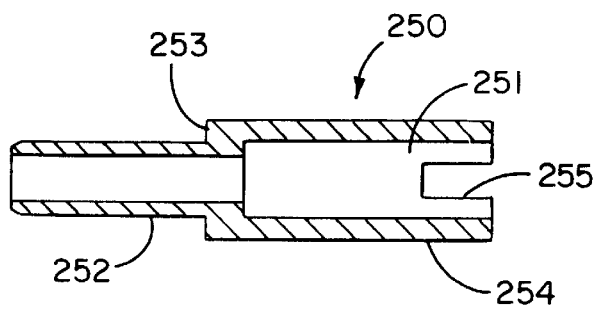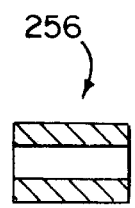
FIG. 33    FIG. 34
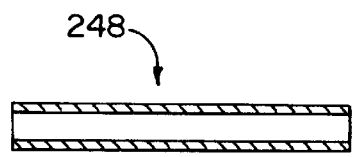
FIG. 35
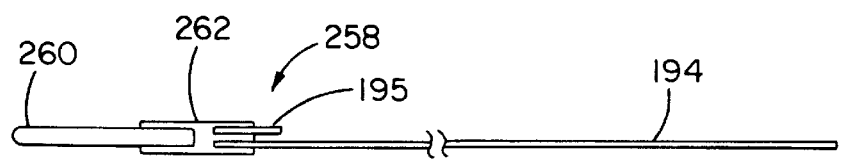
FIG. 36
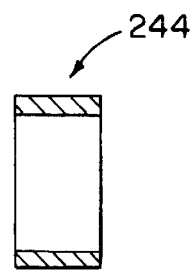
FIG. 37

TRIAXIAL PROBE ASSEMBLY

RELATED APPLICATIONS

This is a continuation-in-part, of a prior application Ser. No. 09/615,454, filed Jul. 13, 2000, now U.S. Pat. No. 6,424,141, which is hereby incorporated herein by reference in its entirety.

BACKGROUND OF THE INVENTION

The present invention relates to an apparatus and method of manufacture for wafer probe station systems and the use of guarding and shielding systems for limiting electrical leakage currents and noise. More particularly, the invention relates to approaches for providing a chuck apparatus system and a probe assembly which facilitate guarding and shielding techniques for improving the accuracy of low current and low voltage measurements of a device-under-test (DUT), typically a wafer containing one or more integrated circuits.

Modern wafer probe stations have been developed for making accurate low voltage and low current measurements of semiconductor integrated circuit wafers and other electronic component applications. Wafer probe stations having a guarding system have been developed for reducing current leakage, with Kelvin connection systems and the like to eliminate voltage losses associated with conductive line resistances, and electromagnetic interference (EMI) shielding elements for minimizing the effects of parasitic capacitance and noise in the test environment. The technique of guarding to minimize current leakage during low current measurements, the use of Kelvin connections for low voltage measurements, and the provision of EMI shielding portions are well known and discussed extensively in the technical literature. In guarding applications, in particular, an isolated conductor surrounding or otherwise positioned closely adjacent to low current circuitry, and maintained at the same or nearly the same potential provided as the low current circuit conductors, reduces leakage currents such that the low current measurements may be made accurately. In shielding applications, conductive material connected to ground potential reduce the effects of EMI from external and probe station electronics and other noise on test measurements.

The need to observe device behavior with very low level current and voltage measurements is being driven by the ongoing reduction in the integrated circuit semiconductor device geometry in order to increase circuit density, facilitate higher speeds, and reduce power consumption. Decreasing the scale of the circuit can provide the aforementioned improvements, however, tradeoffs in performance may also occur. A number of factors can adversely affect low level voltage and current measurements, including, impedances in which an impedance or current path unintentionally shares a noise source or other instrumentation, the transfer of a noise voltage through usually coupled incidental inductances, magnetically coupled noise, incidental capacitive coupling, charge transfer due to the proximity of charge bodies to the test circuitry, and the like. These mechanisms often perturb measurements taken in integrated circuit devices requiring very low level measurements. The measurement of current values in the high attoampere and the low femtoampere regime is particularly difficult in the presence of interfering sources that may be capable of generating current flow of electrons which, though minuscule, may be substantial relative to the very low voltage and low currents being measured.

In one known approach to providing a guarded and shielded chuck assembly, the assembly includes multiple conductive chuck elements spaced vertically and electrically insulated from each other. The upper chuck element supports the test wafer, and a conductive ring mechanically attached to one of the lower chuck elements surrounds the outer periphery of the chuck assembly to serve as a guard element. In such known assembly, an annular air gap between the chuck assembly elements and the surrounding guard ring serves as a dielectric to isolate the guard ring from the conductive wafer support element. A dielectric material may also be present in the annular gap. The size of the annular space provided in such a design directly affects its dielectric properties and capacitance, and in turn the degree of isolation from the support surface on which testing occurs. However, maintaining the desired registration between the chuck elements and the guard ring in such a design may be difficult. Even slight offsets in the associated mechanical connections between the various elements or in the shape of the guard ring can affect the registration and detrimentally alter the performance of the chuck.

Another known approach involves use of a chuck assembly in which the wafer support layer is a first conductive material sputtered on the upper surface of an insulator element, which in turn rests atop a second conductive chuck element. An electrically isolated dish has a bottom portion which extends laterally below the second conductive element, and an annular side wall which extends around the outer periphery of the chuck assembly and terminates vertically opposite the insulator element. The dish may be connected as a shield and the second conductive element as a guard. Such an approach may be suitable in certain applications, but does not provide significant guarding around the side periphery of the conductive support surface and the location of testing. In addition, with the annular side wall of the shield opposing the metal sputtered insulator element, parasitic and parallel capacitance may occur between the shield and the conductive test surface and distort test measurements.

Probe stations commonly include at least one manipulator that sits on the probe station platen and supports a probe holder, which is typically a metal shaft, either straight or bent, that holds the probe tip on one end and is held by the manipulator on the other. The probe tip is the part of the unit that actually touches the device under test. Both probe holders having built in tips and others using changeable or disposable tips have been developed. Several coaxial and triaxial probe assemblies are available for making low voltage or low current measurements. In a triaxial set up, the probe tip is connected to the center conductor of the triaxial cable, a middle conductor extending along the probe holder is driven as a guard and an outer shield conductor is referenced to ground. Such probe assemblies have been used for applications such as measuring device voltage and current, characterization of bi-polar and FET devices, and characterization of high speed devices.

One known triaxial probe assembly uses a conductive needle tip that is removably attached to the forward end of a horizontally extending probe holder for positioning the needle to engage the DUT. The needle projects at an angle to the longitudinal axis as it extends through an angled passageway in the holding portion. The tip is held in position via a set screw inserted into an internally threaded bore that opens to the forward end of the holding portion for pushing the needle against the passageway wall and clamping it against sliding movement.

One problem with the above-described arrangement is that there are competing considerations between using a set screw that is large enough to avoid stripping the screw threads while keeping the size of the holding portion including the set screw to a minimum for fitting the holding portion under a microscope so as not to obscure the line-of-sight to the area between the tip of the needle and DUT and for providing sufficient room to manipulate the probe tip in the area around the DUT, particularly where other probes are simultaneously being used on the same DUT. In practice, the holding portion is larger than desired and the set screw is still fairly small so that manipulation thereof has been found to be difficult.

Another problem is that clamping the very thin needle can create undue stresses on the needle shaft such as where the screw may cause small indentations or surface irregularities to form. It is these points where stress concentrations can occur leading to needle failure and requiring a time-consuming and tedious needle change-out operation, not to mention the loss of the cost of the broken tip.

Because of the precision placements of the tip that are required, it is essential that the needle be held firmly against shifting during manipulation thereof. With the small set screw and the corresponding small threaded bore described above, the tolerances have to be very tight to ensure that any play between the interengaging threads that may cause there to be less than a highly rigid fixturing of the needle be avoided. Accordingly, the use of a set screw to hold the needle introduces several problems both in operation of the probe as well as in its manufacture, particularly with respect to forming the screw and threaded bore to the desired tolerances.

Electrically, the above-described probe assembly also faces difficulties relating to the ability to optimize the shielding and guarding of the center conductor of the triaxial cable. Immediately rearwardly adjacent the conductive holding portion is a ceramic coupling collar through which the center conductor extends for electrically connecting to the needle tip. The guarding and shielding conductors do not extend to the forward holding portion as the outer shielding conductor abuts against the back end of the ceramic collar and the guarding conductor extends just slightly into the collar. As is apparent, because the shielding and guarding conductors stop well short of the terminal probe tip end of the center conductor, they do not provide the protection against common impedances, incidental capacitive coupling, charge transfer, incidental mutual inductances, magnetically-coupled noise, intrinsic noise sources and straight capacitance charging at the probe tip end. Such exposure of the center conductor can generate significant error factors into the low current and low voltage measurements required of the probe assemblies.

Accordingly, there is a need for an improved probe assembly having a replaceable tip. More particularly, a probe assembly is needed that provides the advantages of optimal guarding and shielding of the center conductor with a probe tip that is easily replaceable. In addition, a probe assembly is desired that provides a high degree of rigidity for the mounting of a replaceable probe tip to allow for precision manipulation and placement of the tip on a DUT for taking accurate low level measurements.

It would be desirable therefore to provide an integrated approach to guard and shield systems of wafer probe stations designed to accommodate low level current and voltage measurements with sensitivities in the high attoampere and the low femtoampere regime, which is not easily feasible with presently known designs of guarding systems or shielding systems in commercial probe stations. The shield and guard system should provide electrical isolation as well as for the reduction of parasitic capacitance and noise experienced by the device under test at the conductive test surface. Excessive hysteresis associated with built up electrical charge at the test surface should also be minimized to reduce the time required for stabilizing measurement voltages to the device under test.

Measurements of low level currents in the high attoampere and low femtoampere regime are particularly susceptible to errors induced by capacitive loading, electrical discharge, and noise events which occur because of the dielectric characteristics of nonconductors in and surrounding the conductive test surface, which effects may significantly distort measurement values and limit the accuracy of low voltage and low current measurements. Poor tester and prober grounding or poorly insulated or guarded probes will contribute to electrical noise from power supplies or external circuits which may enter the probing environment and be coupled to the measurements. Additionally, offsets and drifting associated with parasitic capacitances may result in hysteresis of the current and voltage measurements producing erroneous data offsets, inaccuracies, and long measurement times. Advantageously, it would be desirable to provide an integrated approach which brings the overall wafer probe station, probe assembly, and chuck design into cooperative relationship for both guarding and shielding for the reduction of parasitics and noise and which also minimizes the effects of capacitance in the overall system.

SUMMARY OF THE INVENTION

The present invention addresses the problems associated with prior art probe stations by providing an integrated guarding and shielding approach for limiting electrical leakage currents and noise. The guarding and shielding system provides a line-of-sight electrical barrier between a shielding element and the conductive wafer support layer to both minimize leakage currents, parasitic capacitance, electromagnetic interference (EMI) and other noise sources.

Briefly summarized, the invention relates to a chuck apparatus that may be used for both room ambient and thermal probing applications for a wafer probe station in which an upper conductive layer for supporting the DUT is electrically isolated from a lower conductive chuck element by an insulator which positions the upper conductor layer above the lower chuck element and also positions an electrically isolated conductor along its periphery. A further conductive laterally extending element is provided as a shielding element wherein one or more of the lower chuck element and the peripheral conductor form an electrical barrier between the conductive test surface and the shielding element. Alternatively, the shielding element may also be connected as a guard and conductive surfaces of the probe station chassis used as a shield. Various other guarding and shielding approaches are also made possible with the novel chuck apparatus of the invention.

The shielding and guarding approaches described in accordance with one embodiment of the invention provides for the use of a lower chuck element in the form of an aluminum alloy disk or puck with cast-in heating and cooling elements and temperature sensors. In another embodiment, the lower chuck element is a metal coated ceramic disk with case-in heating and cooling elements and sensors. The temperature control elements may be omitted for room ambient applications.

The insulator supported on the lower chuck element may be provided in various geometric configurations to permit a number of arrangements of the conductive test layer, the peripheral conductive element and the lower chuck element relative to each other. The unique design is mechanically rigid, ensures proper registration of the various components over time, and provides improved performance in low voltage and low noise applications. The novel chuck assembly of the invention may be arranged in a variety of electrical connection schemes with the test instrumentation and with the probe station chassis.

The invention also relates to a probe assembly comprising a rigid triaxial probe holder designed to be connected to a replaceable probe cartridge. The probe holder is provided as an extending metal shaft having an integrated triaxial connector at one end for connecting to a test instrument using triaxial cable. First and second semi-rigid conductive members extend within the probe holder along its length and are isolated from each other and from the outer shaft by intervening dielectric material. A replaceable probe cartridge is provided having a center conductive member attached to a needle probe and an outer conductive member extending about the probe and isolated therefrom by an intervening dielectric material. The center conductive member extends beyond the cartridge at the end opposite the probe tip and is sized to mate with the conductive socket connected to the first conductive member of the probe holder to form a removable connection between the probe cartridge and probe holder. The outer conductive member of the probe cartridge also mates with the second conductive member of the probe holder to rigidly secure the probe cartridge to the holder. With this arrangement, the probe tip may be connected to the test instrument, and the outer conductor of the probe cartridge driven as a guard. The outer conductive shaft of the probe holder may be grounded to provide the fully integrated grounded and shielded probe assembly. The unique probe cartridge of the invention provides a replaceable probe tip solution and the ability to guard the probe along its length to a location very near the probe point to provide enhanced performance in low current and low voltage measurement applications. The resulting probe assembly is also mechanically rigid and facilitates fast and convenient probe replacement. The novel design may be arranged in a variety of electrical connection schemes with the test instrumentation and other components of the probe station to provide an integrated guarding and shielding approach for a wide variety of testing applications.

In another aspect of the invention, a probe assembly is provided that allows for replacement of the probe tip thereof via a detachable connection provided between the tip and a probe holder. The probe tip and probe holder include respective conductors that are positioned relative to each other when one tip is replaced with another like tip so that consistent and reliable signal transmission occurs along the pathway formed by the conductors and at the interface therebetween. Preferably, the probe holder rearward conductor includes a tubular portion having a forward end wall portion that is bent over to form a mouth for receipt of rear portion of the tip forward conductor therein. More specifically, the bent over portion extends radially inward and rearward to its annular free end to form a tapered mouth surface that guides the tip conductor into central opening bounded by the annular end when the probe tip is inserted into the probe holder. In addition, the mouth wall portion is resiliently flexible to securely and tightly grip the tip conductor rear portion when inserted therein so that there is a low resistance ohmic contact at the interface between the holder and tip signal or center conductors. In this manner, conductivity degradation at this interface between the holder and replaceable tip is kept to a minimum. This is especially important for the low level measurements that the present probe assembly takes, e.g., on the order of attoAmp signal levels of testing. Further, electrical barriers in the forms of guarding or shielding conductor members can be provided, to improve the accuracy of the measurements being taken of the DUT by way of distal tip end of the probe tip conductor. In the preferred form, the conductor extending about the probe tip extends to closely adjacent the tip end to maximize the electrical protection provided thereby. In this manner, the length of the probe tip that is not guarded is kept to a minimum for accurate signal measurements.

Preferably, the probe tip has a bent configuration for providing an angle of attack toward the DUT, and the guard member is of a metal material that extends along the bent configuration to closely adjacent the tip end so that the probe tip has rigidity and robustness along substantially its entire length. Thus, the probe tip has durability as the added strength provided by the metal guard member extending to closely adjacent the tip end thereof lessens the likelihood of tip end breakage such as due to impacts thereagainst. The rigidity of the probe tip provided by the guard member is also desirable for keeping the tip stable in proper contact with the DUT and minimizing vibrations thereof that may otherwise be generated during its operation.

In a preferred form the tip conductor rear portion includes a biased member that is urged into the mouth of the probe conductor. In this form, the forward and the rearward conductors are resiliently urged toward each other and into intimate contact at their interface along outer surface of the biased member and inner end of the mouth to maintain the tip securely connected to the probe holder to ensure against conductivity degradation that otherwise might adversely affect the accuracy of the low level measurements taken by the probe assembly.

BRIEF DESCRIPTION OF THE DRAWINGS

The novel features believed characteristic of the invention are set forth in the appended claims. The preferred mode of use, further objectives and advantages thereof, is best understood by reference to the following detailed description of the embodiments in conjunction with the accompanying drawings, wherein:

FIG. 1A shows a cross-sectional schematic of the chuck apparatus and probe station of FIG. 1 with an alternate electrical scheme;

FIGS. 4–10 are cross-sectional schematics of other embodiments of a chuck apparatus in accordance with the invention, and FIGS. 4A–10A are top plan views for the chuck apparatuses of FIGS. 4–10, respectively;

FIG. 15 illustrates a top plan view of the chuck of FIG. 15;

FIG. 18 is a perspective view of a probe station system in accordance with the present invention showing a manipulator connected to a probe assembly for low level IC device testing;

FIG. 19 is a side elevation view of the probe assembly including a probe holder and a probe tip having a distal tip end for taking the low level measurements from the device;

FIG. 20 is a sectional view of the probe holder showing center, guard and shield conductors with insulators therebetween;

FIG. 21 is a sectional view of the probe tip showing center and guard conductors with insulators therebetween;

FIG. 28 is a sectional view similar to FIG. 27 showing a probe assembly having an alternative probe tip including a biased rear conductor member that is urged into the mouth opening of the holder center conductor;

FIG. 29 is an enlarged sectional view of the biased rear conductor member showing a barrel housing therefor with a spring between the housing and biased member;

FIG. 30 is an exploded elevational view showing the components of a triaxial connector assembly located at an end of the probe holder for electrically connecting the probe holder and probe tip to test instrumentation;

FIG. 31 is a sectional view of the outer body component of the triaxial connector assembly having a threaded end portion for connection to a triaxial cable;

FIG. 32 is a sectional view of an insulative tubular component of the triaxial connector assembly of the probe holder;

FIG. 33 is a sectional view of a conductive guard component of the triaxial connector assembly of the probe holder;

FIG. 34 is a sectional view of a conductive tubular connector of the triaxial connector assembly of the probe holder;

FIG. 35 is a sectional view of an insulative tubular component of the triaxial connector assembly of the probe holder;

FIG. 36 is an elevational view of the signal conductor assembly of the triaxial connector of the probe holder, showing a signal pin connected to a wire conductor;

FIG. 37 is a sectional view of a conductive tubular connector of the triaxial connector assembly of the probe holder;

DETAILED DESCRIPTION OF THE PREFERRED EMBODIMENTS

Figure 1:
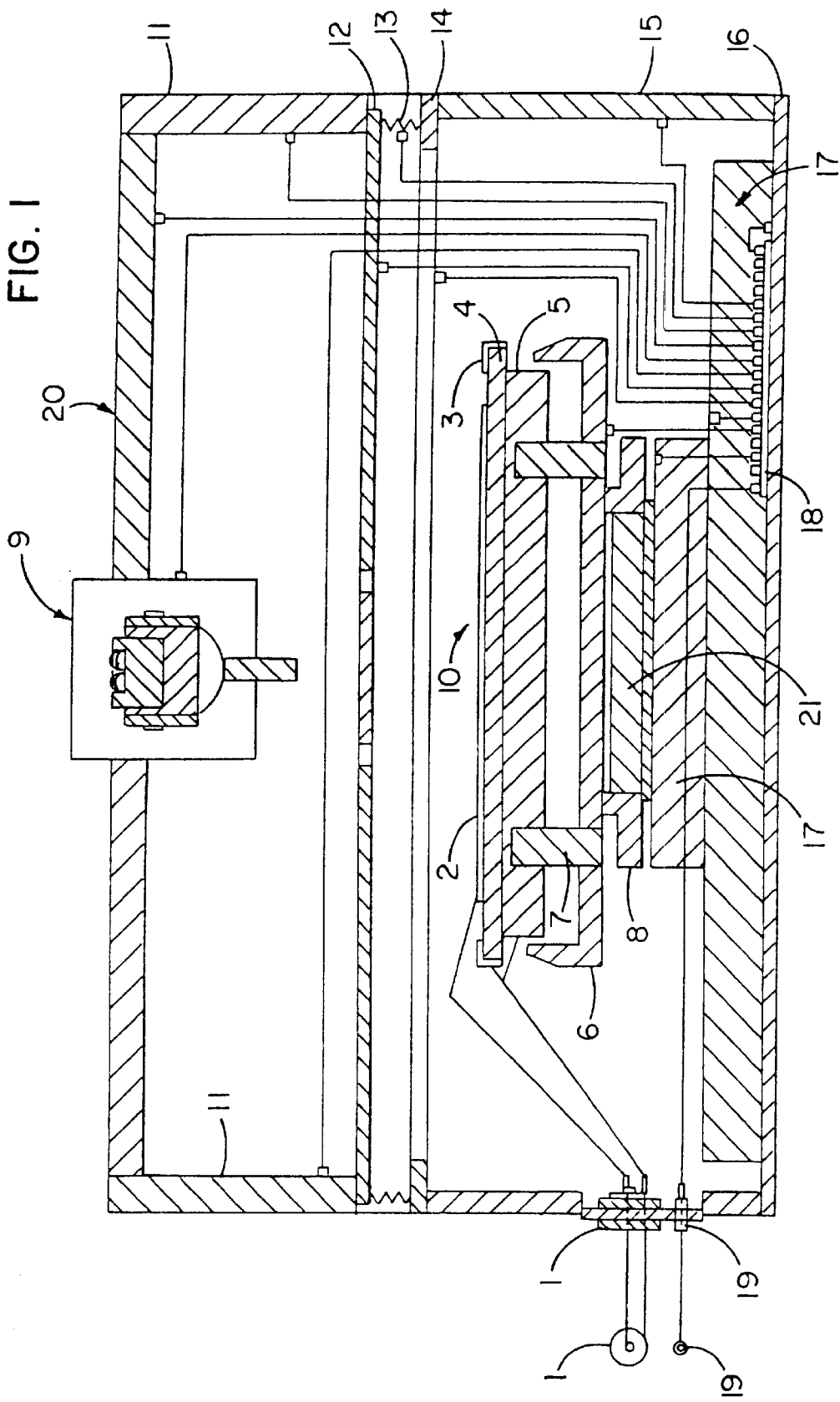
FIG. 1 illustrates a cross-sectional schematic of an embodiment of a chuck apparatus in a wafer probe station environment in accordance with the invention.

With reference to FIG. 1, a wafer probe station embodiment is shown in which a chuck apparatus 10 is supported within a probe station chassis. The chuck apparatus supports a wafer or other semiconductor integrated circuit device under test (DUT). The chuck apparatus 10 may be independently moved along X and Y axes using a positioner (not shown), which controls the X and Y components of the stage 17. The chuck apparatus 10 is positioned on a hub 21, which is attached to the X/Y stage construction 17 of the wafer probe station. As shown, a coaxial connection 1 is indicated for electrical signals being provided to the wafer probe station. Another connection 19 is provided to facilitate grounding of the probe station chassis by means of central point ground 18. As shown in FIG. 1A, a triaxial connection implementation may also be provided for the electrical signals, e.g., force, guard, and sense, that are applied at the wafer probe station to facilitate grounding of triaxial cable used to connect test instrumentation.

As illustrated, a microscope 9 is provided with a mount and X/Y/Z drive mechanisms on a microscope bridge 20 for positioning over the chuck apparatus 10, with microscope bridge supports 11 supporting the microscope bridge. A platen 12 is provided for supporting manipulators (not shown) for electrical probes, which can be maneuvered to make electrical contact at a desired location of the device under test on the chuck apparatus 10. The probes may also be provided in the form of a probe card inserted in the central opening of the platen, as is known in the art. The platen 12 is supported above a baseplate 14 on a mechanism which permits the platen to be moved vertically. Moving the platen in the vertical direction permits point contact to be made between each test probe and the DUT. A flexible bellows 13 extends from the base plate 14 to the platen 12 along the sides and front of the probe station chassis to provide a temperature, humidity, and light barrier for maintaining the desired environmental conditions for the DUT. As shown, the bellows 13 is provided with a conductive lining, such as a copper mesh lining which may be electrically connected to the central point ground 18. The central point ground 18 provides a central point for all significant probe station elements to be grounded to a single point to reduce measurement noise in the wafer probe station. Thus, as shown, each of the conductive components of the probe station may be grounded by connection to the central point ground 18. The probe station base plate 14 is supported by opposite side legs 15, and a bottom cover 16 extends laterally between the side legs to complete the lower chassis of the probe station. In the embodiment shown in FIG. 1, an external ground connection 19 is provided for grounding external elements by connection to the central ground point 18. A coaxial connector 1 provides two isolated connections to components of the chuck apparatus 10. In the alternative embodiment of FIG. 1A, the connector 1 may be a triaxial connector and the outer conductor of a triaxial cable also connected thereby to the central point ground 18.

The construction of the chuck apparatus 10 will be described further in connection with the embodiments discussed below, which advantageously provide for accurate registration and alignment between the conductor and insulator elements that facilitate the low noise characteristics of the chuck apparatus 10. To this end, the method of manufacture discussed below provides for disposing a central conductive surface atop an insulative plate, and positioning an electrically isolated conductor along the periphery of the insulative plate so as to leave a portion of uncoated insulator material between the two deposited conductive regions. Thus formed, the central conductive surface resides on the insulative plate with the electrically isolated peripheral conductor being spaced from the central conductive surface, facilitating permanent accurate registration between the conductive elements, as discussed further below.

With reference to FIGS. 1–10A and 15–17B, with like reference numerals indicating structures of the thermal chuck apparatus 10 that are common between the embodiments, a triaxial connector 1 is provided for connecting the wafer probe station to external instrumentation. A coaxial connection may be substituted for the triaxial connector and the chassis ground being provided with a separate ground strap as shown in FIG. 1. As illustrated, a first conductive element 2 is deposited on an electrical insulator element 4, such as a ceramic material, by plasma discharge sputtering, electroplating or other suitable technique. The first conductive element supports the wafer for testing. The insulator element 4 is supported on a second conductive element 5, which may comprise an aluminum alloy disk-shaped element with cast in heating and cooling elements and temperature sensors. The heating elements are provided as electric resistive heaters, and the cooling elements comprise metal tubes connected to a source of liquid or vapor coolant. The temperature sensors are connected to a temperature controller which monitors and controls the temperature by control of the heating and cooling elements. In such a thermal chuck, the insulator 4 should be a good thermal conductor to transfer heat from the heated conductive element 5 to the test surface. The conductive element 5 may alternatively be a ceramic disk with cast in heating, cooling, and temperature sensor elements, and a metalized outer surface.

A third conductive element 6 has a bottom portion which extends laterally below the second conductive element 5, and an annular side wall which extends opposite the outer periphery of the second conductive element. FIG. 3A, for example, shows the top plan view of the thermal chuck apparatus of FIG. 3, illustrating the concentric third conductive element 6 opposing the second conductive element 5 of the chuck apparatus.

The element 6 is provided with insulative supports 7 for supporting the second conductive element 5 above the laterally extending bottom portion of element 6. The supports 7 may be sapphire rods extending into corresponding bores in the conductive elements 5 and 6, as shown. The bores in element 5 preferably extend to within 0.020–0.060 inches from the top surface of element 5. This has been found to minimize the amount of vertical expansion associated with temperature variations of conductive element 5. A dielectric material may also be provided in the space between conductive elements 5 and 6 if desired. The chuck apparatus 10 is connected to an insulated hub adaptor 8 for connection with the hub 21. Referring to FIG. 1A, the hub 21 attaches the chuck apparatus to the X, Y stage assembly 17 to facilitate movement of the chuck apparatus in the X and Y lateral directions. The hub is connected in a manner that permits it to rotate in order to align the chuck apparatus and test wafer as desired.

Figure 3:
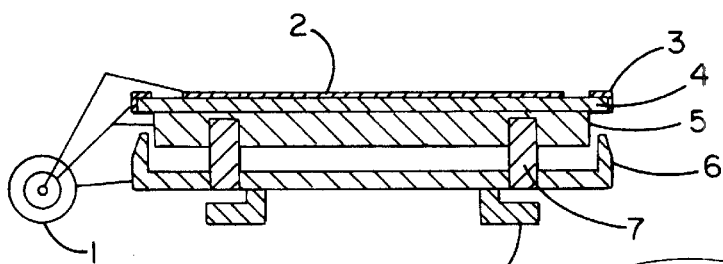
FIG. 3 shows an enlarged cross-sectional schematic of the chuck apparatus of the wafer probe station of FIGS. 1 and 1A in which a further isolated conductive element extends along the periphery of the insulator.
Figure 3A:
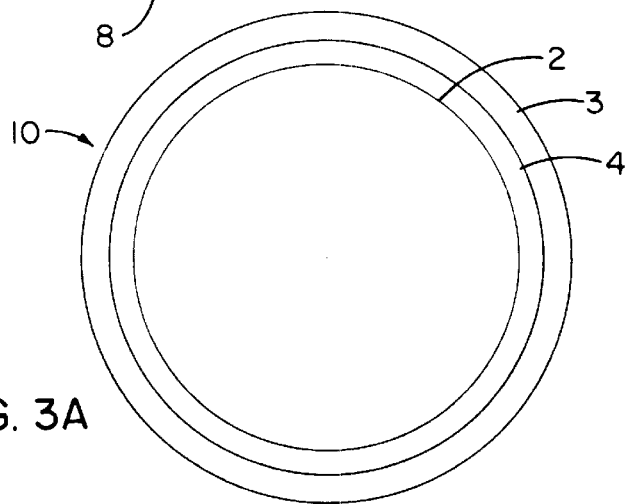
FIG. 3A is a top plan view of the chuck apparatus of the wafer probe station of FIGS. 1 and 1A.

With specific reference to FIG. 3, which shows an enlarged view of the chuck apparatus of FIGS. 1 and 1A, improved measurement capabilities are provided by connecting the center conductor of triaxial connector 1 to the first conductive element 2, and connecting the middle conductor of the triaxial connector as a guard connection to element 5, and also to an isolated conductor 3 spaced from the second conductive element 5. The test surface is the centrally located conductive element 2 for supporting the DUT. The diameter of the test surface is dictated by the size of the wafers to be tested. Typical wafer size may be 8 inches in diameter, although the chuck may be sized to accommodate any other wafer size, such as 25 mm–300 mm wafers and semiconductor integrated circuits. Also, while the invention is described with reference to a chuck having a circular cross-section, chucks and the associated insulator and conductive elements of other geometrics, e.g., square, rectangular, oval, etc., may be constructed in accordance with the invention.

In the embodiment of FIG. 3, the insulator 4 positions the first conductive element 2 above the second conductive element 5. A fourth electrically isolated conductor 3 is also disposed on the insulator. As shown in the plan view of FIG. 3A, the first conductive element 2 is positioned centrally and the electrically isolated conductor 3 forms a concentric ring about the conductive element 2 with an insulative region therebetween. The center conductive element 2 preferably comprises a metal deposited on the top surface of the insulator 4 where the semiconductor integrated circuit device DUT may be placed. The conductive element 3 is also a deposited metal which, as illustrated, forms an interruption in the metal coating to provide for an insulative barrier between the conductive element 2 and the conductor 3. The fourth conductive element 3 also has a side portion which extends around the outer periphery of insulator element 4. Preferably, the conductive element 3 extends down along the entire periphery of insulator element 4, as shown, but it is also possible to terminate the conductive material at a location on the periphery above the bottom edge of the insulator.

The diameter of insulator element 4 is larger than that of the second conductive element 5 to provide a greater insulative barrier between the conductor element 3 and conductive element 2 in the radial or horizontal direction. Preferably, the amount of insulation provided between the conductors 2 and 3 radially is greater than or equal to the bulk thickness of the insulator 4. In other words, the concentric gap between the conductive element 2 and the isolated fourth conductive element 3 is preferably greater than or equal to the thickness of the insulator 4 to minimize electrical leakage or conductance in the low femtoampere and high attoampere regime. The diameter of the conductive element 2 is typically that of the largest test wafer to be tested. For example, for an 8-inch wafer and a conductive element 3 that extends radially 0.025 inches on an insulator that is 0.312 inches thick, the overall diameter of the chuck insulator 4 should extend at least approximately 8.674 inches (8"+2×0.312"+2×0.025"). The conductive element 5 is preferably of larger diameter than the wafer diameter so that the effects of thermal losses to the atmosphere at the peripheral edge of the element 5 are moved away from and therefore minimized at the test wafer, and improved proper temperature control and uniformity are achieved.

The thickness of the metal deposited on conductive elements 2 and 3 is such as to make good ohmic contact for the application of test signals in the case of the center conductor 2 in contact with the DUT, and to ensure a very low sheet resistance value for the counter conductor 2 and the fourth conductive element 3. Therefore, the coatings may be as thin as 1 micron, or thicker without significant change in overall performance in order to accommodate thermal expansion associated with the thermal chuck apparatus for operation over a temperature range of, e.g., −65 to +400° C., or beyond.

In the arrangement shown in FIG. 3, the outer conductor of the triaxial connector 1 is coupled to the third conductive element 6 and grounded for providing electromagnetic interference (EMI) shielding of the conductor 2 supporting the DUT and second conductive element 5. In this arrangement, the conductive components of the probe station chassis may provide shielding from noise sources external to the probe station, and the third conductive element 6 may provide shielding from noise sources internal and external to the probe station, including noise from positioning motors for the X, Y stage assembly and other internal electronic devices. The second conductive element 5 and the ring-shaped conductive element 3 are connected via the middle conductor of the triaxial connector 1 as a guard to provide a barrier between the test surface and the shield elements and to minimize leakage currents at the test surface.

Accordingly, the chuck apparatus 10 of FIG. 3 includes a center conductive element 2 for supporting the DUT, a lower conductive element 5, and an intervening insulator 4 for positioning the conductive element 2 above the conductive element 5. The electrically isolated conductor 3 is provided as a horizontally extending ring concentric with the first conductive element 2, and may also extend vertically along the outer lateral edge of the chuck insulator 4. A further isolated conductive element 6 is provided below conductive element 5 and has a portion extending vertically around the side periphery of the conductive element 5. The first conductive element 2 and the insulator 4 are circular, and the insulator 4 has a diameter greater than the diameter of the first conductive element 2 and that of conductive element 5. In this arrangement, the combination of the conductive elements 3 and 5 provide line-of-sight guarding between the conductive element 2 and the conductive element 6 to minimize current leakage from the element 2 and the DUT which it supports. The guard elements also provide an electrical barrier to minimize stray capacitance and noise in the chuck apparatus. The larger diameter of the upper chuck insulator 4 provides for proper isolation between the center conductive element 2 and the guard conductive element 3. The conductive element 3 facilitates additional guarding around the side periphery of the conductive test areas and provides an electrical barrier between the test area and conductive components of the probe station to the side of the test area. Thus, in this embodiment, the vertical sidewall of conductive element 6 may extend further upward than shown in FIG. 3 toward the test surface because the guard conductor 3 reduces the capacitive effects between the test surface and the side wall of element 6.

As should be apparent, the conductive elements 2 and 3 are fixed relative to each other such that the desired concentric registration between these elements is always maintained after assembly. Proper spacing of the conductive element 2 and the conductive element 5 is likewise maintained by the solid insulator 4. Accordingly, the desired isolation, capacitance and thermal characteristics designed into the chuck apparatus by selection of materials and dimensions are maintained throughout the life of the chuck.

Figure 6:
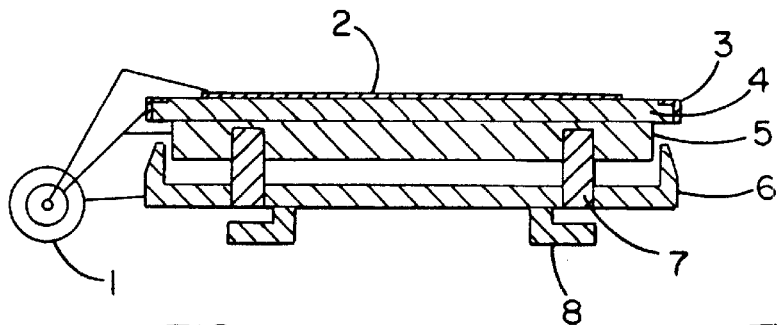
Figure 6A:
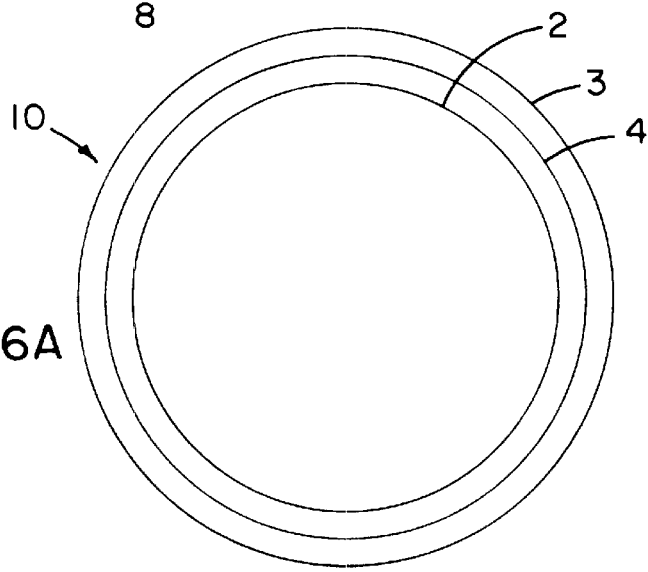

In FIGS. 4, 5, and 6, embodiments are illustrated for positive relief and negative relief metalized surfaces on the chuck insulator 4 for providing the deposited center conductive element 2 and/or the electrically isolated conductive element 3. In FIG. 4, there is illustrated a positive relief on the surface of the insulator 4 which separates conductive elements 2 and 3, essentially placing the ceramic insulator material between the conductive elements. The conductive element 2 is disposed in a central recess formed in the insulator and the conductive element 3 is disposed in a peripheral groove in the insulator. Such an arrangement provides a more sleek product appearance without adversely affecting the performance of the chuck, and has other benefits in terms of manufacturing and/or mechanical integrity. Providing the ceramic insulator around the side periphery of the conductive element 2 also improves the temperature uniformity of the chuck apparatus compared to the embodiment of FIG. 3 by reducing thermal losses to the atmosphere at the edge of the element 2.

In the embodiment of FIG. 5, a central recess is provided in the insulator 4, which allows the center conductive element 2 to be positioned slightly below the horizontally extending portion of the fourth conductive element 3, and also below the upper surface of insulator 4. Such an arrangement enhances the effectiveness of conductive element 3 in guarding the test surface in a direction above and to the side of the outer periphery of the test surface, and may also improve thermal uniformity. In the embodiment of FIG. 6, the conductive ring is recessed in a groove extending around the circumference of insulator 4 such that the horizontal portion of element 3 and the upper surface of the insulator lie in a horizontal plane below the center conductive element 2. This arrangement enhances guarding of the test surface in a direction below and to the side of the outer periphery of the test surface.

Figure 7:
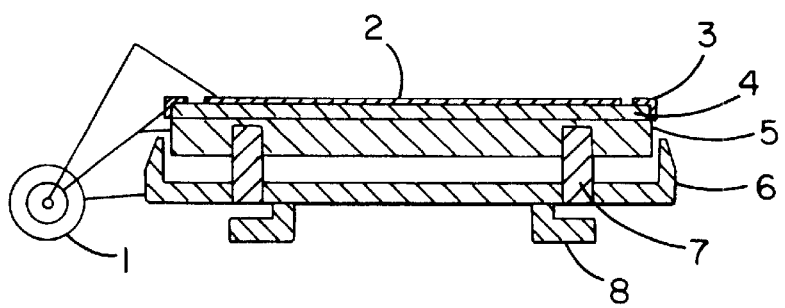
Figure 7A:
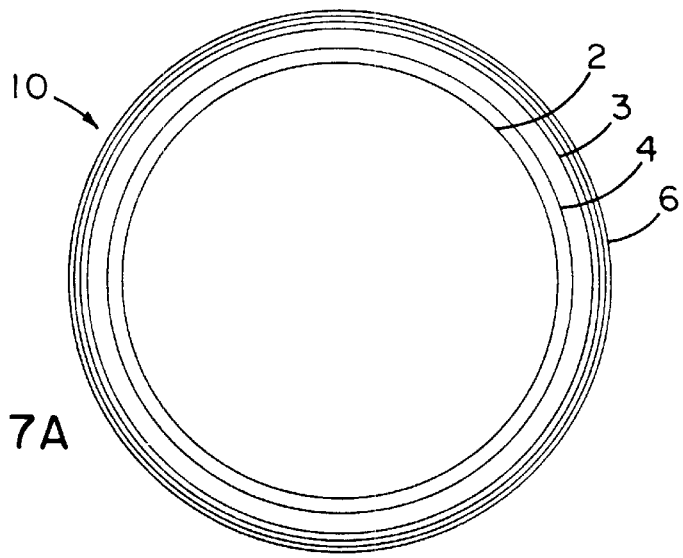
Figure 8:
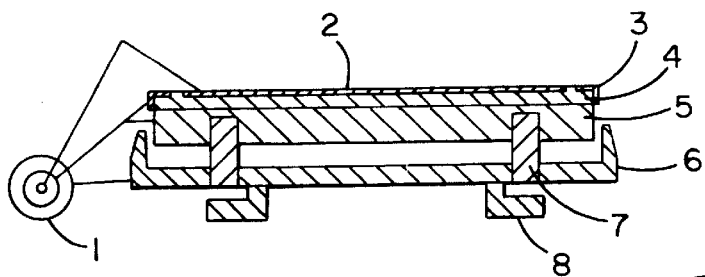
Figure 8A:
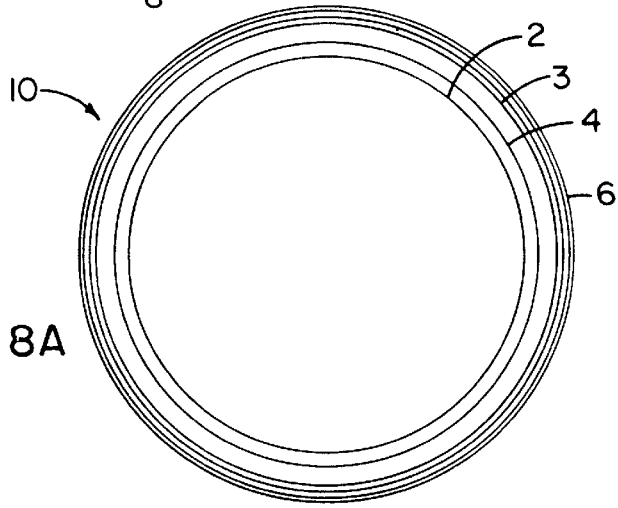
Figure 9:
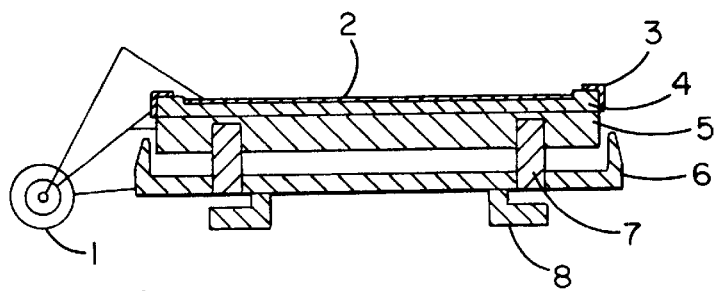
Figure 9A:
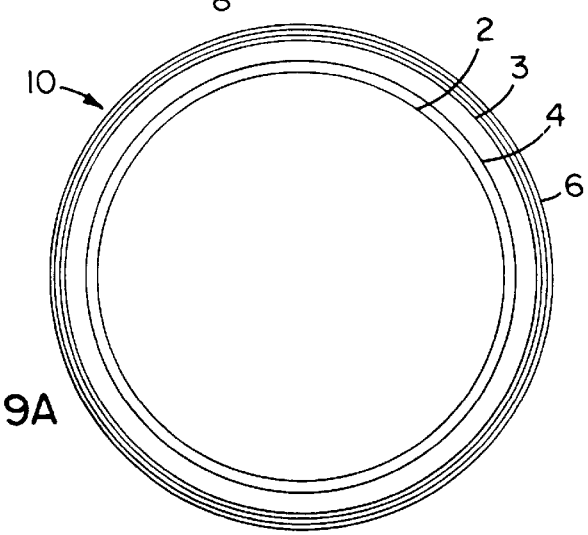
Figure 10:
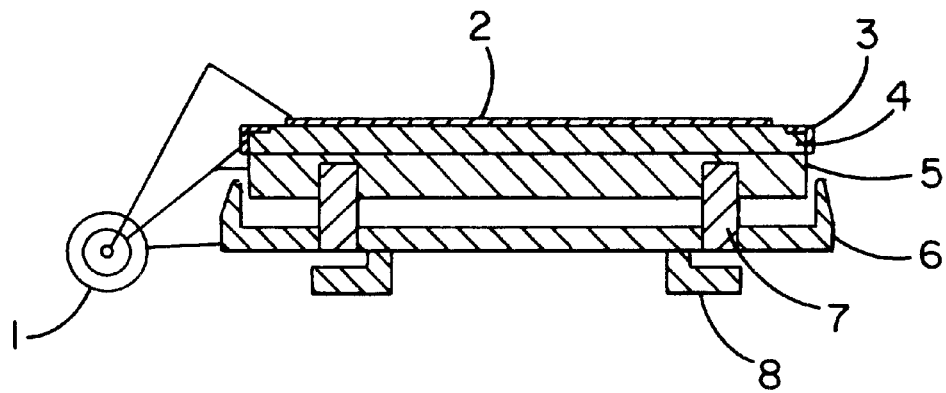
Figure 10A:
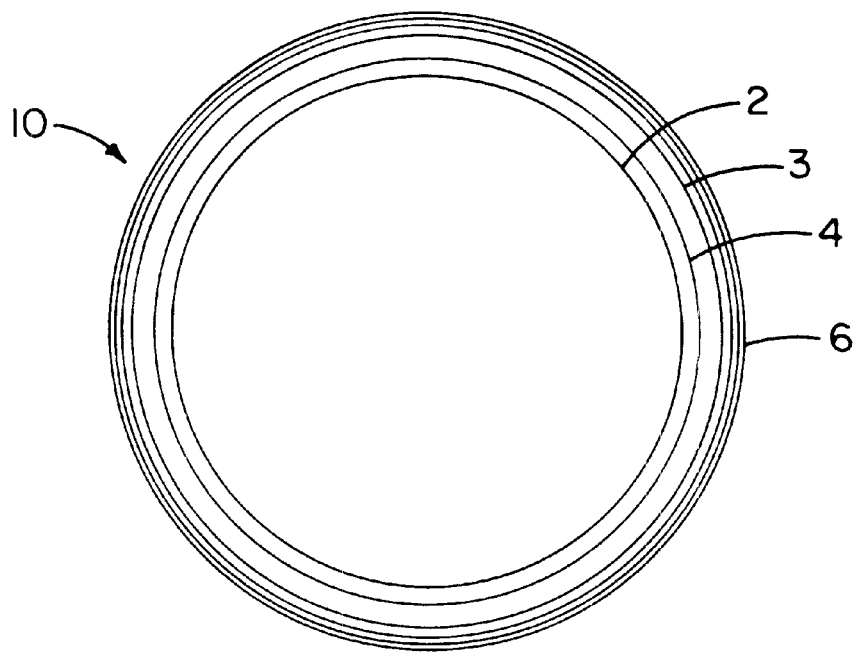

In the embodiments shown in FIGS. 7–10, the insulator 4 and conductive element 5 of the chuck apparatus have approximately the same diameter, which is larger than the diameter of the center conductive element 2. The approach of FIGS. 7–10 thus provides greater thermal uniformity across the conductive element 2 and DUT compared to embodiments of FIGS. 3–6. This is because heated conductive element 5 more effectively heats the outer periphery of insulator 4 and thereby minimizes edge thermal losses from conductive element 2. With both the insulator 4 and conductive element 5 of larger diameter than the center conduit element 2, such edge effects are also moved away from the conductive element 2 and DUT. In all other respects, the embodiment of FIG. 7 corresponds to FIG. 3. As illustrated, both FIG. 3 and FIG. 7 show the surface of the chuck insulator 4 with separated metal layers 2 and 3 providing the center conductive element 2 and electrically isolated conductor 3, respectively. With reference to FIGS. 8–10, positive and negative relief for the deposited metal are provided in a fashion which corresponds to FIGS. 4–6, respectively.

Figure 2:
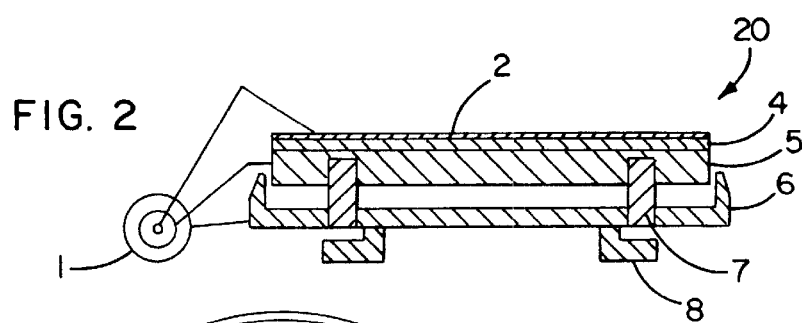
FIG. 2 shows a cross-sectional schematic of a probe station chuck with a conductive testing surface isolated from a lower conductive element by an insulator, and a further isolated conductive element having a laterally extending portion and a portion extending vertically opposite the side periphery of the lower conductive element.
Figure 2A:
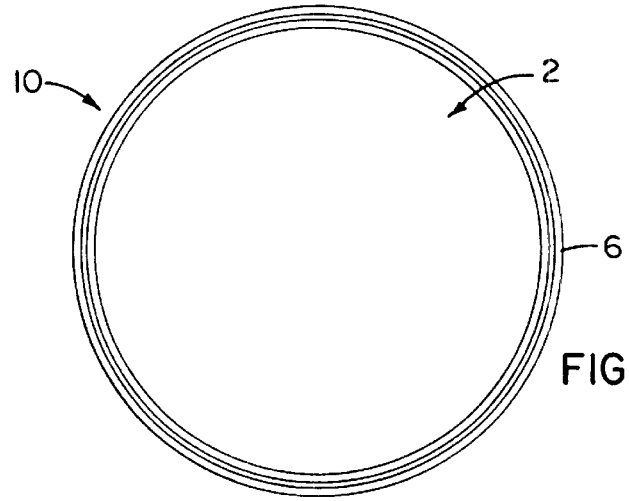
FIG. 2A is a top plan view of the chuck embodiment of FIG. 2 illustrating the vertical side wall of the further isolated conductive element concentric with the center test surface.

FIGS. 2 and 2A illustrate embodiments in which the conductive element 3 is omitted, and the center conductive element 2 extends over the entire upper surface area of the insulator 4. The side wall portion of the third conductive element 6 terminates vertically at a location below the insulator element 4, and also below the first conductive element 2. Thus, the element 6 does not approach the vicinity of the test surface or the DUT. In the preferred embodiment, the side wall terminates at least 5–10 mm below the test surface. The apparatus constructed in this manner may be arranged with the center conductor of a triaxial cable connected to the center conductive element 2, the middle conductor connected to element 5 as a guard, and the outer conductor and element 6 connected to ground as a shield. Arranged in this manner, the element 5 thus provides a line-of-sight guard barrier between at least a majority of the test surface and the shield element 6 to facilitate low noise measurements. Also, the effects of parallel and parasitic capacitance between the conductive elements 6 and 2 are reduced because the vertical side wall of the conductive element 6 does not oppose the conductive element 2. This approach is also suitable for making low noise and low current measurements.

Figure 11A:
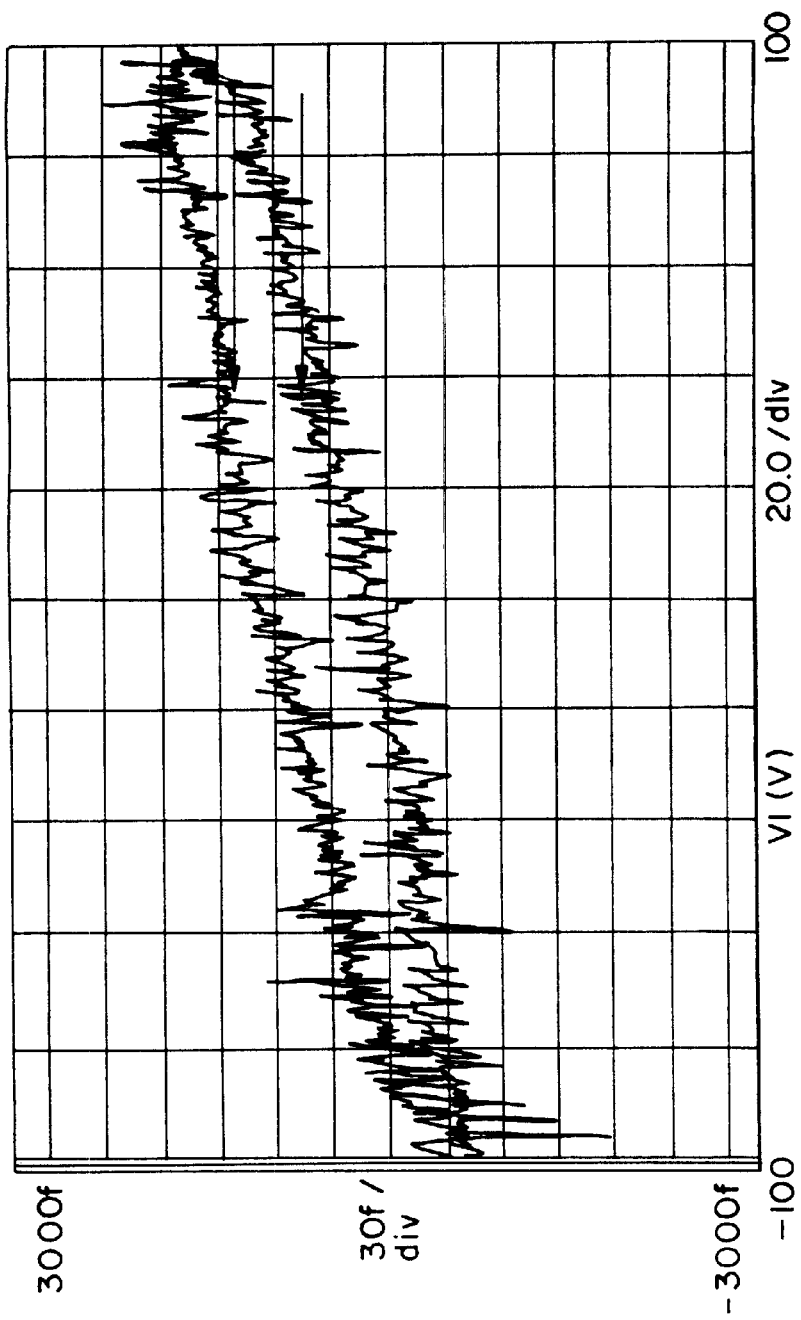
FIGS. 11A and 11B are graphs showing the hysteresis of leakage measurements associated with the chuck apparatus of FIG. 2 and FIG. 3, respectively.
Figure 11B:
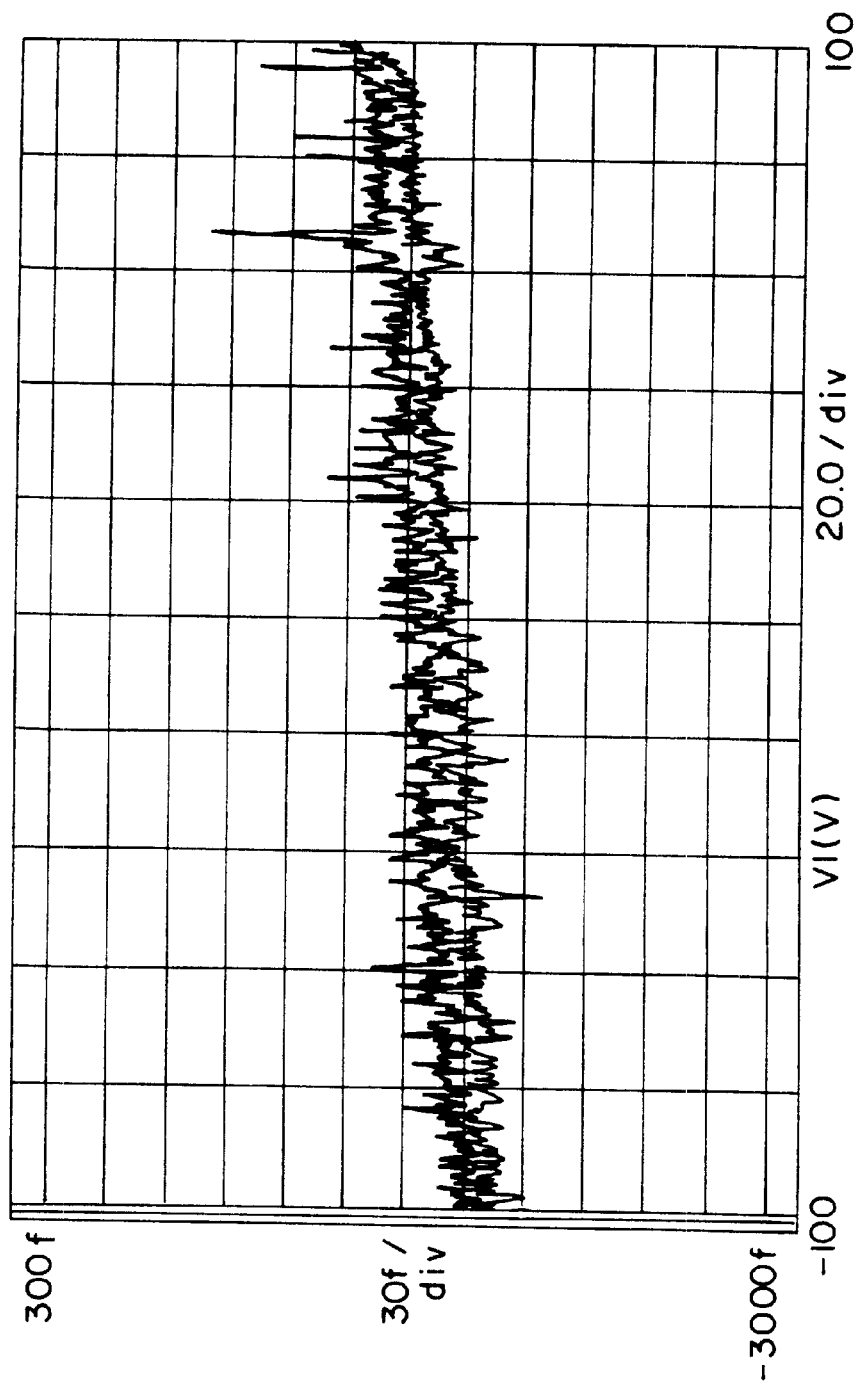

Experimental tests were performed for comparing operational characteristics of the thermal chuck apparatus of FIGS. 2 and 3 to illustrate the advantages of incorporating the electrically isolated conductor 3 with the conductive element 5 so as to provide an improved line-of-sight electrical barrier between the center conductive element 2 and the laterally extending conductive element 6. FIGS. 11A and 11B are graphs showing the hysteresis of leakage measurements associated with the chuck apparatus of FIG. 2 and FIG. 3, respectively. A voltage applied to the center conductive element 2 was swept from −100 v to 100 v and back, and the leakage current was measured using an HP4156 parametric analyzer. Thus, in FIG. 11A, the lower curve indicates the leakage currents measured as voltage at the test surface is increased; whereas the upper curve illustrates an elevated leakage current associated with hysteresis in the chuck caused by parasitic capacitances. There is measurable hysteresis in the raised chuck assembly of FIG. 2, i.e., between 50 and 100 femtoamperes, as illustrated by the vertical gap between the two arrows in FIG. 11A. This hysteresis value is substantially improved relative to previous designs where the shield element extended vertically near the test surface, indicating that system capacitance has been reduced. In FIG. 11B, on the other hand, there is little or no hysteresis illustrated in the chuck apparatus of FIG. 3. This demonstrates the effectiveness of the line-of-sight guarding of conductive element 3 between the test surface and the shield element 6. This additional guarding has reduced the current leakage and effective capacitance even further, as shown by the reduced hysteresis and the reduced slope of the curves in FIG. 11B.

Figure 12A:
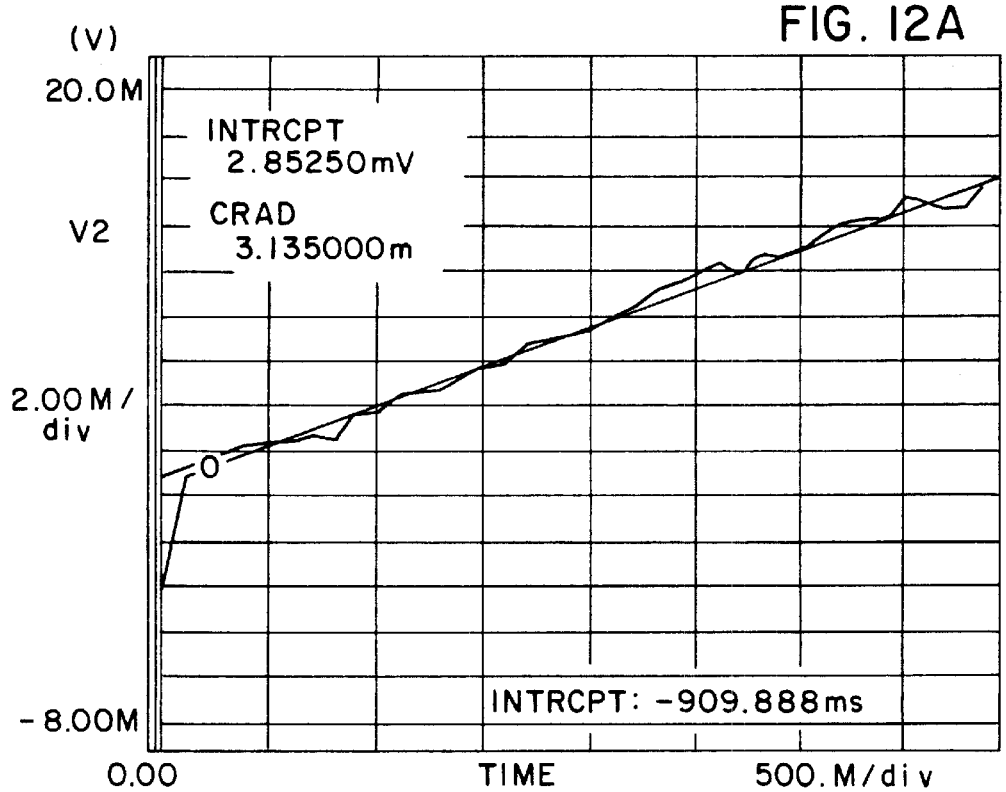
FIGS. 12A and 12B graphically illustrate the capacitance measurements associated with the chuck apparatus of FIG. 2 and FIG. 3, respectively.
Figure 12B:
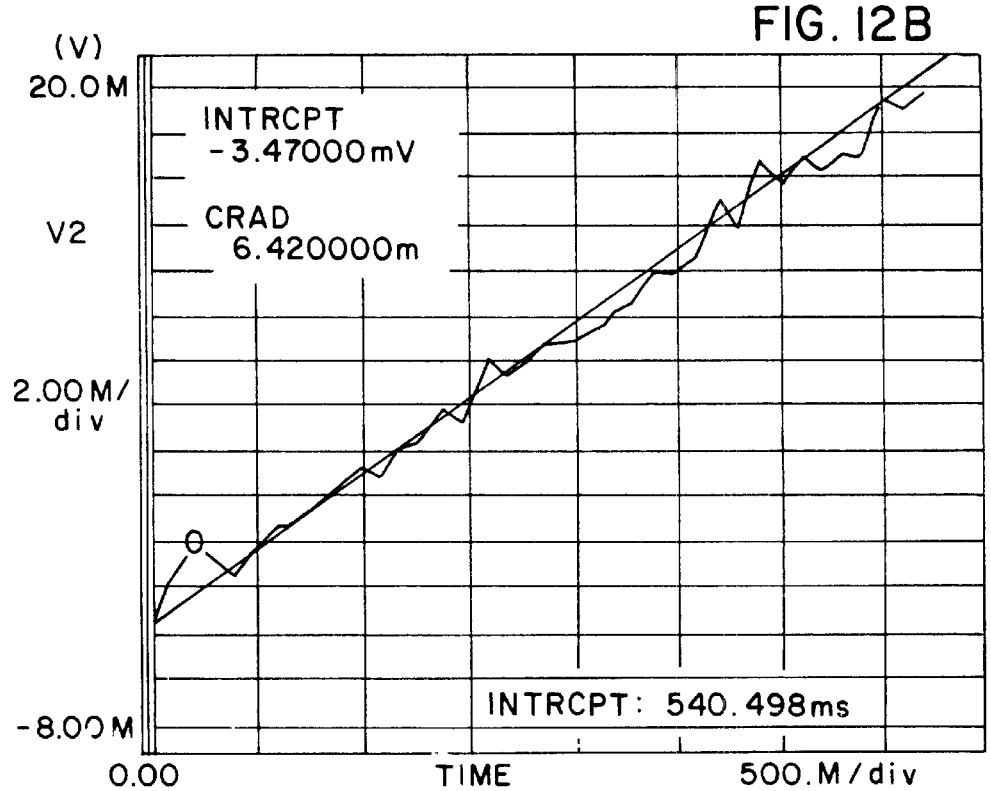

FIGS. 12A and 12B graphically illustrate the capacitance measurements associated with the chuck apparatus of FIG. 2 and FIG. 3, respectively. Capacitance is inversely proportional to the distance between adjacent conductors, or the thickness of the insulator 4 in this case. The embodiment of FIG. 2 was tested using a ceramic plate insulator 4 of approximately 0.312 inches thick. Measured separately the plate's ceramic capacitance was approximately 320 to 360 picofarads. In FIG. 12A, with the chuck having this native capacitance of 320–360 pF, a stray capacitance of only 15–16 pF was observed with the chuck apparatus of FIG. 2, indicating that the system capacitance has been reduced by increasing the distance between the test surface and the conductive element 6 and due to the intervening guard element 5. Significantly, in FIG. 12B the same test measured only a 7 to 8 picofarad stray capacitance associated with the embodiment of FIG. 3, a substantially improved measurement. This was achieved using an insulator 0.187 inches thick with a native capacitance of about 550 pf. This significant reduction to only 7–8 picofarad stray capacitance is associated with the provision of the isolated conductive element 3 connected as a guard.

Figure 13A:
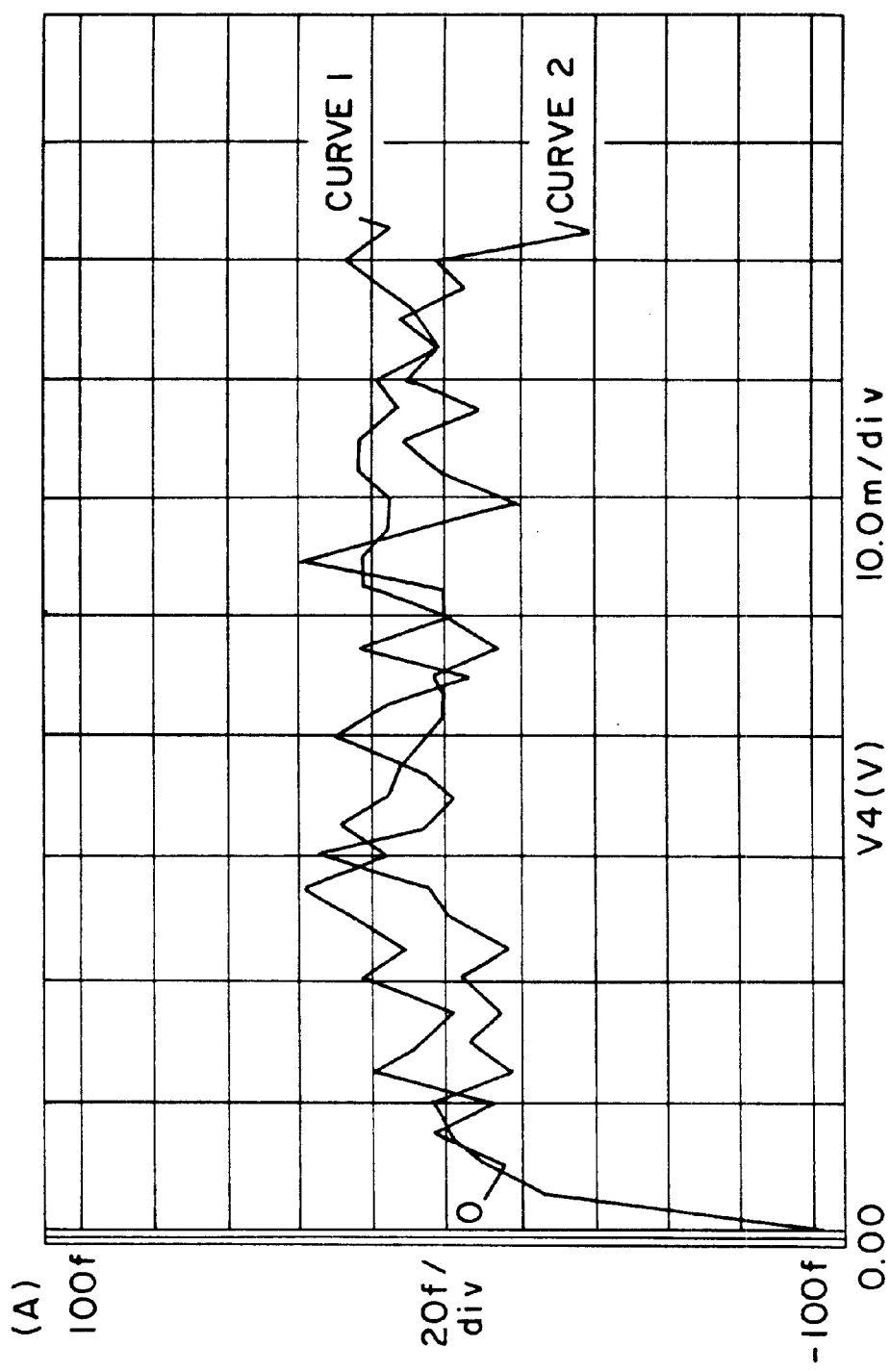
FIGS. 13A and 13B graphically illustrate the settling times associated with measurements performed with the chuck apparatus of FIG. 2 and FIG. 3, respectively.
Figure 13B:
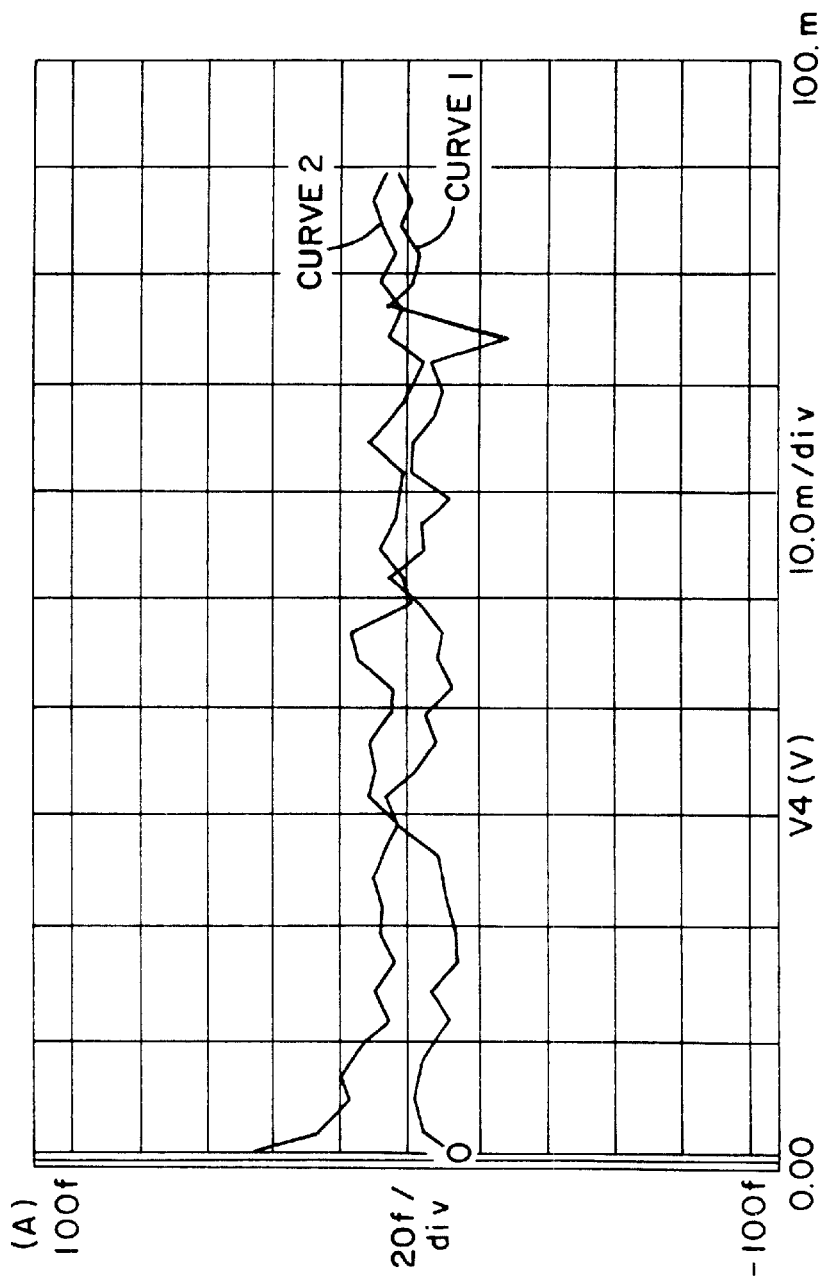

FIGS. 13A and 13B graphically illustrate the settling times associated with the system capacitance of the chuck apparatus of FIG. 2 and FIG. 3, respectively. The settling time represents the time necessary to dissipate stray currents at the test surface. Each figure shows the measured noise at the test surface at 0 applied voltage (Curve 1) and at a predetermined applied voltage (Curve 2). FIG. 13A illustrates a settling time of approximately 5 seconds for the chuck of FIG. 2, but there is some appreciable noise beyond 5 seconds. There necessarily will be some settling time due to the high electrical isolation of the upper chuck insulator 4, and the capacitance of the system which is associated with a resistive capacitive (RC) time constant. The measurable charging current represented by the vertical distance between the two points indicated by the arrows is due to the system's capacitive effects when a voltage is applied. The relative short time for this current to dissipate indicates that capacitance effects were reduced. FIG. 13B illustrates that the chuck apparatus of FIG. 3 also settles within about 5 seconds. Curve 1 was generated at 0 voltage and Curve 2 was measured at an applied voltage. The charging current represented by the arrows at Curve 2 associated with the system capacitance is significantly reduced. The noise associated with the design of FIG. 3 was also considerably less, as shown by the relative flatness of the curves.

Figure 14A:
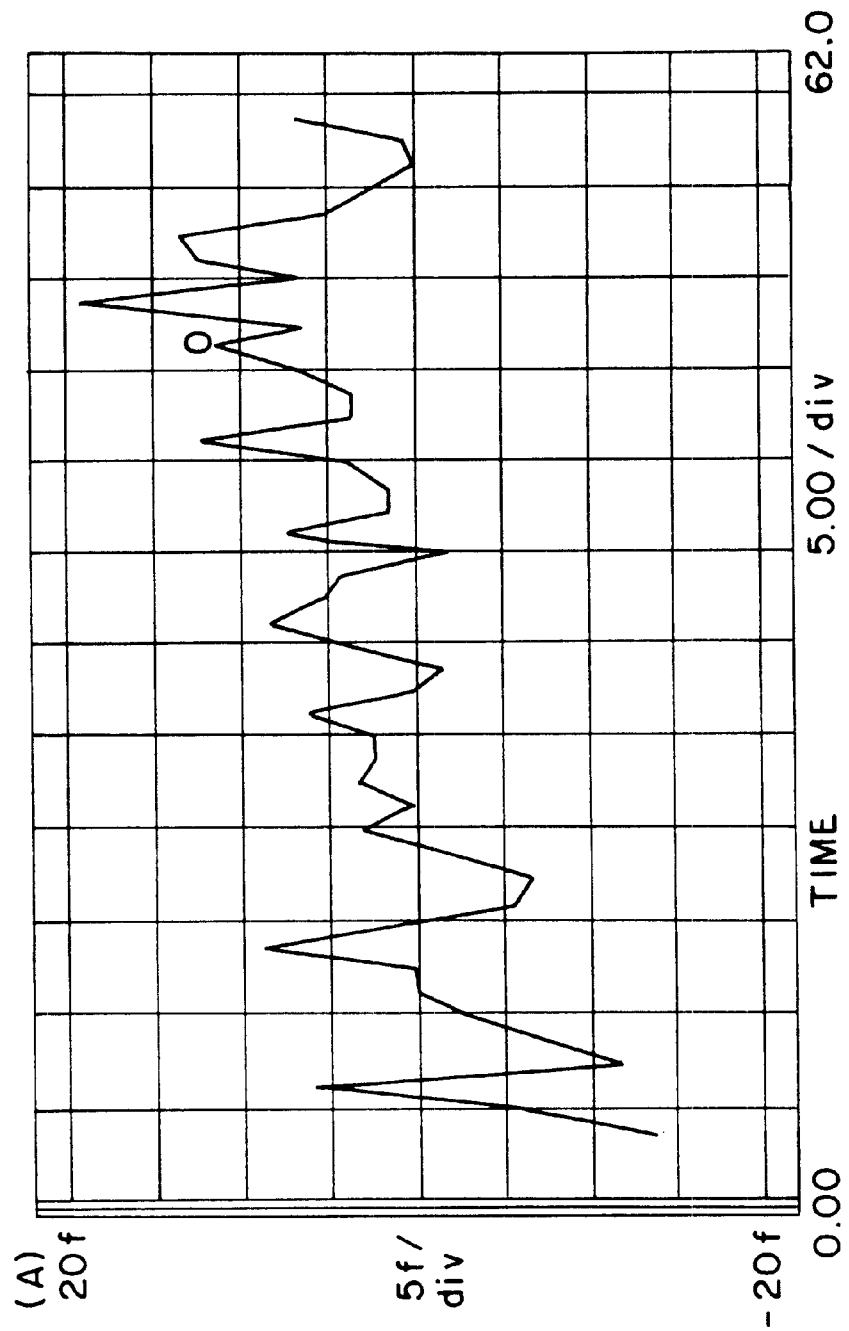
FIGS. 14A and 14B graphically show the noise measurements associated with the chuck apparatus of FIG. 2 and FIG. 3, respectively.
Figure 14B:
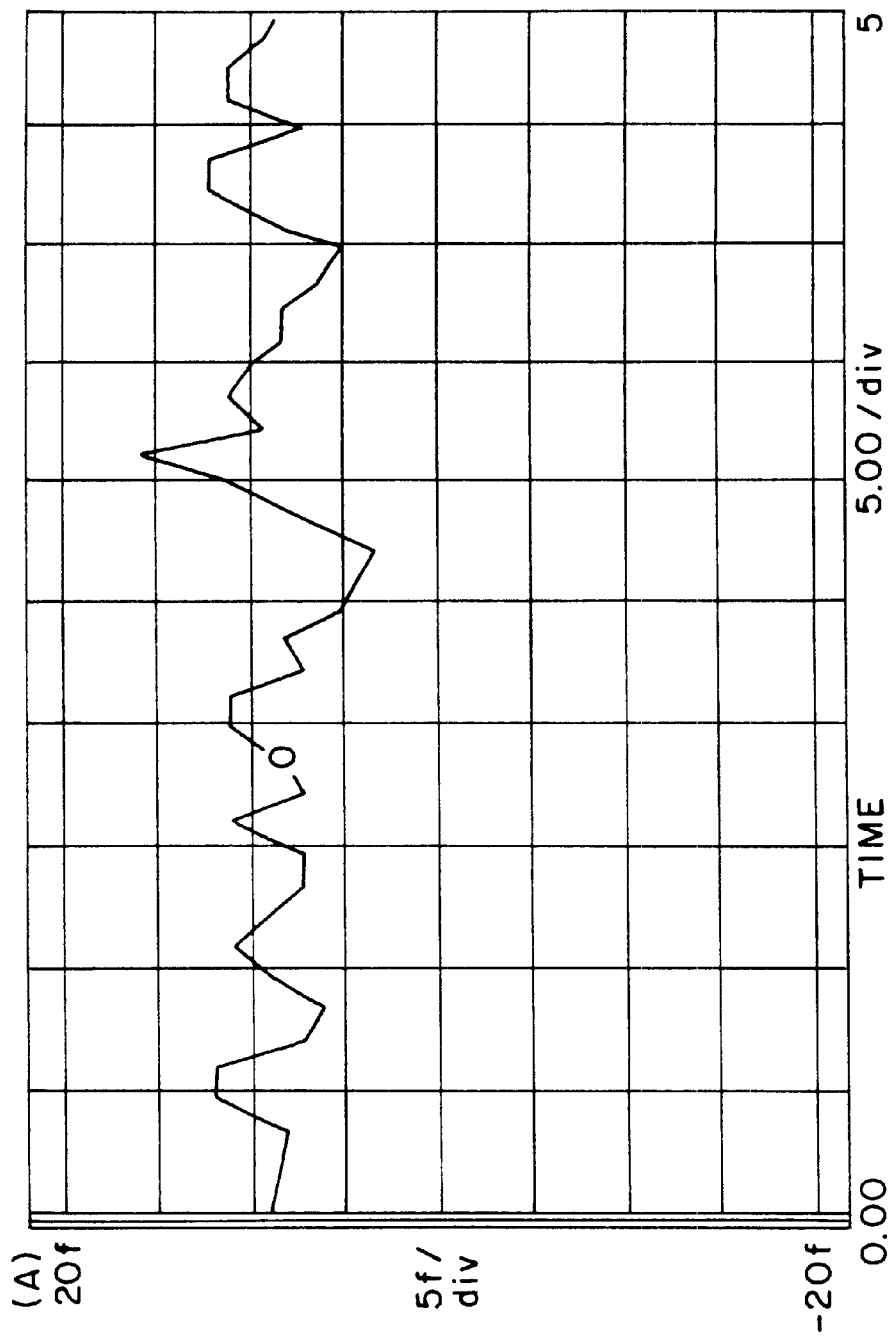

FIGS. 14A and 14B graphically illustrate the noise measurements associated with the chuck apparatus of FIG. 2 and FIG. 3, on a more narrow scale. In FIG. 14A, the graph illustrates the noise characteristics associated with the embodiment of FIG. 2. The upward slope of the curve between the points designated by the arrows is an indication that some settling is still occurring after 5 seconds. FIG. 14B illustrates that the embodiment of FIG. 3 demonstrated lower settling time with a maximum of 10 femtoamperes of noise with electrical isolation in the ceramic insulator 4 of approximately 1 teraohm. Except for the portion of the curve between the arrows, the noise curve is relatively flat and constant. The noise associated with the design of FIG. 2 without the guard ring 3 was somewhat higher, but still acceptable for achieving low noise measurements.

The prototype associated with the embodiment of FIG. 3 utilized a chuck insulator of approximately 0.187 inches thickness, capacitance of approximately 550 picofarads, and electrical insulation of about 1 teraohm at 500 VDC. The ceramic plate insulator of the prototype of the design of FIG. 2 was approximately 0.312 inches thick with less capacitance, e.g., 340 picofarads and electrical insulation significantly greater at 10 teraohms. Advantageously, in both designs substantial isolation of the test surface and low parasitic capacitance has been demonstrated. By providing in the embodiment of FIG. 3 a guarding system including a metal ring deposited on the periphery of an insulator and a conductive element below the insulator, a line-of-sight electrical barrier is achieved between the shielding element and the test surface and chuck performance is improved.

Figure 15:
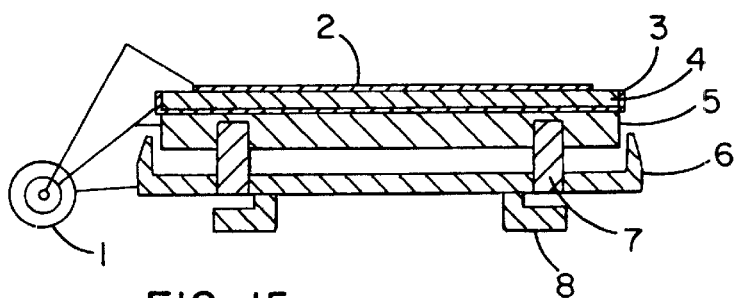
FIG. 15 illustrates a cross-sectional schematic of another chuck apparatus in which an electrically isolated conductor is provided along the outer side periphery and bottom surface of the chuck insulator element.
Figure 15A:
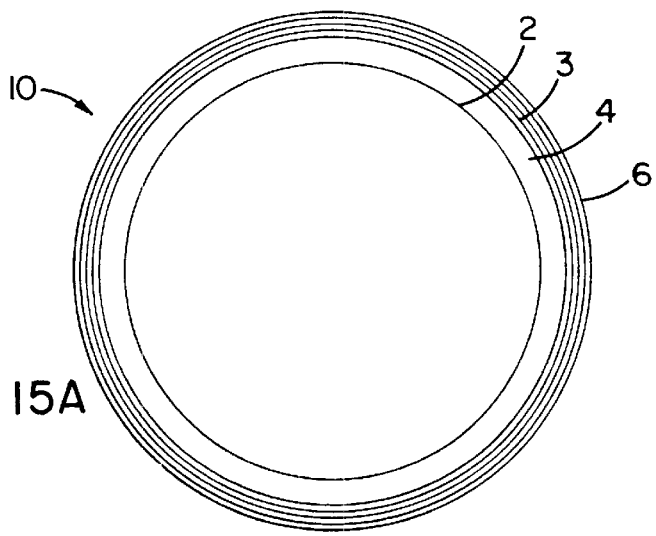

FIGS. 15 and 15A illustrate another embodiment in which the fourth conductive element 3 is disposed along the outer edge and bottom portion of the chuck insulator 4. In this embodiment, the conductive element 3 is coupled to conductive element 5, which together are isolated from the center conductive element 2. The conductive elements 3 and 5 may thus provide a conductive guard barrier which also facilitates reduced capacitive coupling with respect to the center conductive element 2.

Figure 16:
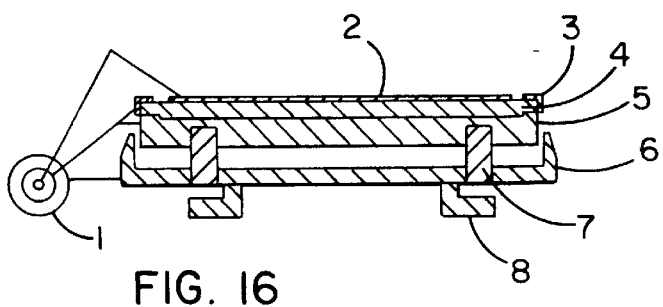
FIG. 16 is a cross-sectional schematic of a further embodiment of a chuck apparatus in accordance with the invention in which the insulator is mated in a recess in the lower conductive element.
Figure 16A:
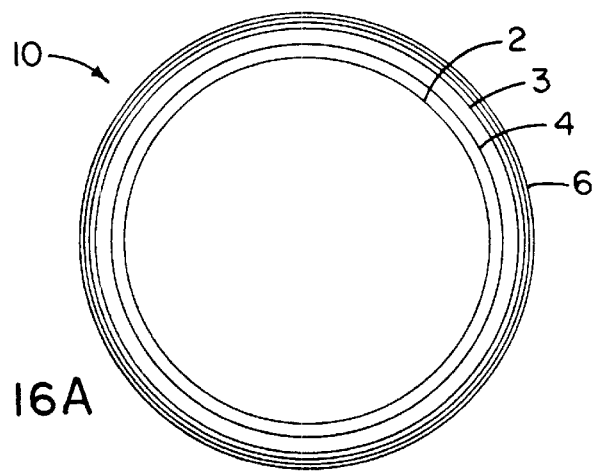
FIG. 16A illustrates a top plan view of the chuck of FIG. 16.

It will be appreciated that numerous other variation of the chuck apparatuses described herein may be provided in accordance with the invention. FIGS. 16 and 16A illustrate a further aspect of the invention in which insulator 4 has a thicker central portion and a thinner peripheral portion and conductive element 5 includes a central recessed portion for receiving the thicker central portion of the insulator. In this aspect of the invention, the mating of the central portion of insulator 4 and the recess of conductive element 5 maintains proper registration of these elements with respect to each other. In one aspect, the insulator 4 is approximately 0.312 inches thick at its center and 0.262 inches thick at its outer periphery, and the central recess of conductive element 5 is approximately 0.050 inches deep for receiving the central portion of the insulator. Although this aspect of the invention is illustrated in FIGS. 16 and 16A with respect to a chuck apparatus otherwise in accordance with the embodiment of FIG. 7, such an arrangement of the insulator 4 with respect to conductive element 5 may, of course, also be utilized in any of the other embodiments of the invention described herein.

Figure 17:
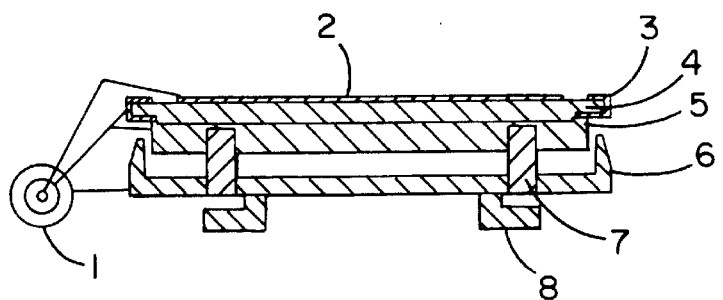
FIG. 17 is a cross-sectional schematic of another embodiment of a chuck apparatus in accordance with the invention in which an isolated conductive element extends along the upper, side and bottom surface of the insulator at its periphery.
Figure 17A:
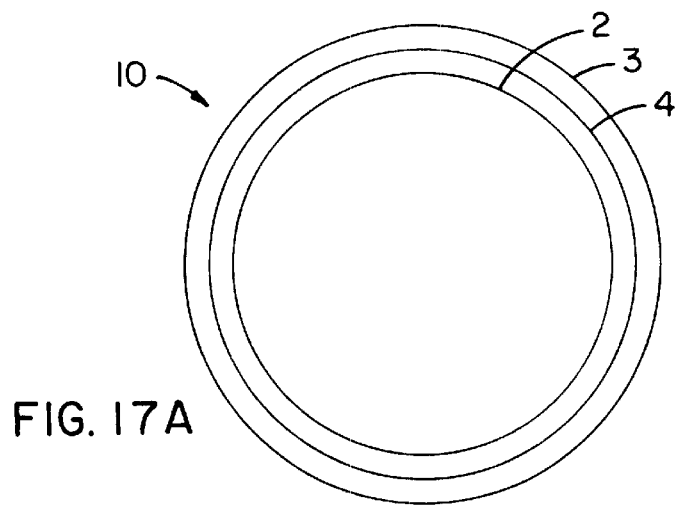
FIG. 17A illustrates a top plan view of the chuck of FIG. 17.
Figure 17B:
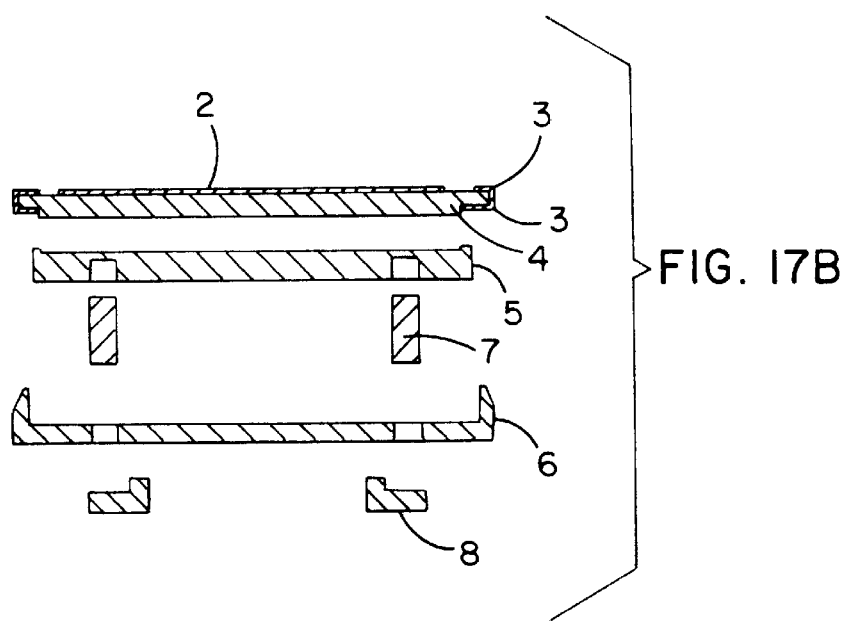
FIG. 17B illustrates an exploded cross-sectional schematic thereof.

As a further aspect of the invention, FIGS. 17, 17A and 17B illustrate that the isolated conductive element 3 may be provided to extend around the periphery of insulator 4 along the upper, side, and lower surface of insulator 4. In the embodiment illustrated, the conductive element 3 wraps around the insulator 4 and extends into the groove provided at the outer periphery of the bottom surface of the insulator. As shown more clearly in the exploded view of FIG. 17B, the conductive material forming conductive element 3 does not completely fill the peripheral insulator groove, and the center portion of insulator 4 protrudes beyond the conductive element 3 for mating with the corresponding central recess in conductive element 5 to maintain proper registration between the insulator 4 and conductive element 5. By extending the conductive element 5 to wrap around the outer portion of the bottom surface of insulator 4, improved line-of-sight guarding may be achieved between the center conductive element 2 and the shield conductive element 6, particularly in embodiments such as shown in FIGS. 3–6 where the diameter of the insulator 4 is larger than the diameter of conductive element 5.

Accordingly, in each of the above-described embodiments and examples, a chuck apparatus comprises a conductive wafer support surface deposited on an insulator element. The insulator element is supported on a further conductive element, which in turn is spaced and isolated from a bottom conductor which extends laterally below the chuck apparatus. While the invention thus far described employs the conductive element supporting the insulator as a guard conductor, and the lower most conductor as a shield, one of skill in the art will recognize that numerous variations of this electrical hookup are possible and perhaps desirable depending on the desired test conditions. Thus, in the chuck apparatus illustrated in FIG. 2, both conductive element 5 and 6 may be grounded and used as a shield. Alternatively, both elements can be connected to a potential near that of the test potential and driven as guard elements, perhaps with other conductive components of the probe station chassis grounded to provide shielding from external noise sources.

With respect to the embodiments of FIGS. 3–10A and 15–17B, which incorporate the isolated annular fourth conductive element 3, the element 3 may be driven as a guard or grounded to provide shielding. The same applies to isolated conductive elements 5 and 6. Thus, it will be appreciated that the chuck apparatus of those embodiments contains three isolated conductive elements in the vicinity of the test surface which may be coupled to each other, to a guard line, or to a ground connection in any desired coaxial or triaxial arrangement to facilitate an electrical environment at the point of testing suitable for the test to be conducted. For example, in some applications it may be desirable to ground all three available conductive elements; whereas in others the conductive element 3 may be driven as a guard and elements 5 and 6 grounded. Thus, the unique design of the chuck apparatus of the invention provides substantial flexibility in test setup and operation.

Moreover, while the invention has been described in accordance with the preferred embodiment as a thermal chuck, the invention may also be applied to non-temperature controlled, or ambient chucks. In such an embodiment, the heating, cooling, and temperature sensor elements are omitted from the bulk of conductive element 5.

The chuck apparatus of the invention is suitable for use in any number of available probe stations to provide guarding and shielding capabilities for low current measurements. For example, it is not necessary that a bellows be provided between the probe station base and platen or that the bellows include a conductive lining, although such features facilitate additional shielding from external sources of noise. The probe station may include various alternative manual or motorized controls for moving the chuck apparatus in the X, Y and/or vertical Z directions. In any probe station, the chuck apparatus provides a superior design with improved noise and thermal characteristics.

The invention also encompasses a method of manufacturing the chuck apparatus embodiment described above. The method involves providing an insulator plate of suitable thermal conductivity and of a size sufficient to accommodate the test wafer, the conductive element disposed on its periphery, and a suitable gap therebetween. The center conductive surface and isolated peripheral ring conductor may be deposited by any known metal deposition technique such as plasma discharge sputtering, chemical vapor deposition, or electroplating. A solid mask technique may be used to interrupt the deposition of conductive material between the center and outer periphery of the insulator 4. This method involves placing a solid metal or ceramic ring on the insulator at the desired location of interruption, depositing the conductive material over the insulator and ring, followed by removing the ring to provide the two separated areas of conductive material. The side surface of the insulator, bottom surface or a portion thereof may also be coated with conductive material during the deposition process. A suitable photomasking technique may also be used to deposit the spaced conductive coatings on the insulator. Regardless of the method employed, the deposition is performed so as to leave a radial space between the conductive elements that is preferably at least as large as the thickness of the insulator.

The coated insulator may then be supported on a conductive thermal element formed by encapsulating heating and cooling elements in an aluminum alloy. In the preferred method, metal cooling tubes are suspended in a casting mold. Additional tubes containing electric heating elements are also suspended in the mold, as are one or more temperature sensors. Molten aluminum is poured into the mold and allowed to cool so as to completely encapsulate those elements with minimal air gaps, so as to provide better temperature uniformity. The mold may provide a recess in the upper surface of the thermal element for receiving a protruding central portion of the insulator and maintaining proper registration or alignment of these components.

The resulting thermal disk may be attached to a laterally extending conductive element by insulated fasteners which also serve to space the heated disk from the laterally extending conductor. The preferred insulator is sapphire rods, and the rods are preferably press fit into bores in the conductive thermal disk and the lower laterally extending conductive element. The laterally extending conductor is then connected to a lower insulative adaptor for connecting the chuck apparatus to a positioning mechanism. Suitable electrical connections should also be provided to each of the conductive elements of the chuck apparatus to complete the apparatus.

Turning next to FIGS. 18–27, a probe assembly 100 is shown that provides the advantage of having a replaceable probe tip 102 via a detachable connection 104 between the tip 102 and a probe holder 106 while still having the ability to make highly accurate low level voltage or current measurements, i.e., at femtoampere levels, of different sites 108 of a wafer 110 including integrated circuits thereon. To this end, both the probe holder 106 and the probe tip 102 include electrical barriers such as in the form of guard and/or shield conductors, generally designated 112 and 114, respectively, that limit the electrical conditions or the effects thereof that can create measurement inaccuracies in the low level measurements taken by the probe assembly 100.

Figure 22:
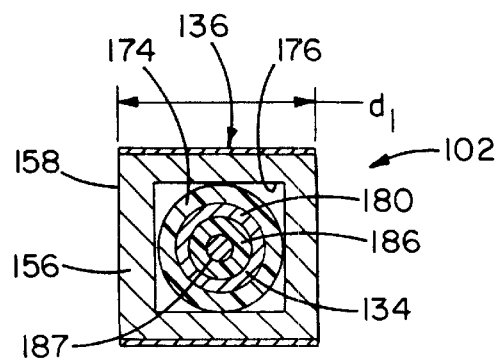
FIG. 22 is a cross-sectional view taken along line 22—22 of FIG. 21, showing the configuration of the probe tip guard conductor including an enlarged square portion and a reduced size annular portion.
Figure 26:
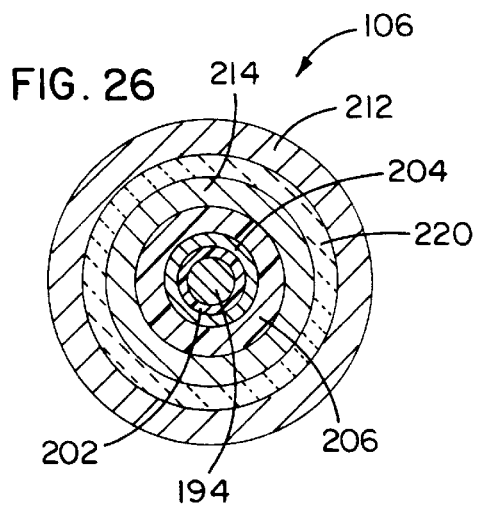
FIG. 26 is a cross-sectional view taken along line 26—26 of FIG. 20, showing the triaxial arrangement of the conductors and insulators of the probe holder rearward of the detachable connection between the holder and the probe tip.
Figure 23:
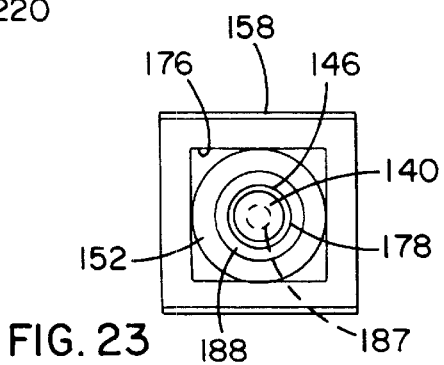
FIG. 23 is a rear end elevational view of the probe tip taken along line 23—23 of FIG. 21 showing an enlarged plug portion of the center conductor in the square guard portion.

In the preferred and illustrated form, the electrical barrier of the probe tip 102 is guard member 116. Referring more particularly to FIGS. 21–23, the guard member 116 is of a metallic conductive material such as a gold plated copper material and extends along the length of the probe tip 102 to a terminal end 118 thereof that is closely adjacent distal tip end 120 of the probe tip 102. A forward conductor 122 is centrally disposed in the probe tip 102 and serves as the signal conductor for transmitting signals to and taking measurements from the DUT 110 by way of the engagement of the distal tip end 120 therewith. The forward conductor 122 is of a highly conductive material such as a tungsten, metallic material.

The guard member 116 and forward conductor 122 are driven to at or near the same electric potential via electrical controls (not shown) for protecting the test area against conditions that can create inaccuracies in the low level measurements. By having the terminal end 118 of the guard member 116 closely adjacent the center conductor distal tip end 120, the length of the conductor 122 projecting beyond the terminal end 118 is kept to a minimum. In this manner, the exposed conductor projecting portion 124 essentially provides the smallest possible antennae for the probe assembly 100 minimizing the amount of interfering electrical noise thereat. For example, the small size of the projecting portion 124 minimizes the capacitance levels normally induced by the probe which can be reduced down to the attoFarad levels with the probe assembly 100 herein. By way of example and not limitation, the projecting portion 124 of the forward conductor 122 has a length of about 0.25 inches between the guard terminal end 118 and the conductor distal tip end 120, and more preferably, a length of about 0.1 to 0.15 inches.

As best seen in FIG. 19, the probe tip 102 has a bent configuration so that the projecting portion 124 has a predetermined angle of attack toward the DUT 110. The probe assembly 100 has a main horizontal section 125 that extends along longitudinal axis 125a of the probe assembly 100 for positioning of the projecting portion 124 adjacent the DUT 110 remote from manipulator 126, as will be more particularly described herein. As shown in FIG. 21, the projecting portion 124 can define an attack angle A of approximately 45° with the axis 125a. The user may wish to change the attack angle to accommodate the physical space limitations of the probe station and spacial orientation of integrated circuits present in a given test application. The detachable connection 104 permits probe tips of different attack angles to be quickly and conveniently interchanged by the user when a different attack angle is desired. Probe tips having attack angles from 45° to 70° are suitable for many test applications, but attack angles outside this range may also be utilized.

As is apparent, precision placement of the distal tip end 120 on the test site 108 requires highly accurate movements of the probe assembly 100 by the manipulator 126. As can be seen in FIG. 18, the manipulator 126 can include X, Y and Z drive mechanisms, designated 128, 130 and 132, respectively, for moving the probe assembly 100 in respective X, Y and Z axes of movement. The contact of the distal tip end 120 of the probe assembly conductor 122 with the test site 108 needs to be sufficiently secure to obtain accurate test measurements, especially with the low level measurements discussed herein. Poor or incomplete contact of the probe end 120 with the DUT 110 can create noise and distortion in the measurement data obtained from the probe assembly 100.

The small size of the miniaturized circuits being tested on the wafers 110 requires precision placement of the distal tip end 120 which itself, must typically be sharpened to a fine point configuration and precision moved into engagement with the site 108 to be tested. To this end, the probe assembly 100, and in particular the probe tip 102 thereof must fit under the objective microscope 9 (FIG. 1) and allow the area between the tip end 120 and the test site 108 to be readily viewed in an unimpeded manner so that precision contact of the tip end 120 can be made on the test site 108. Further, the contact of the distal end 120 with the site 108 should be stable and secure so that the end 120 stays in uniform engagement with the site 108 during testing. In this regard, vibrations of the probe assembly 102 and particularly the tip portion 102 thereof should be minimized.

Referring more specifically to FIG. 21, there it can be seen that the guard member 116 associated with the probe tip 102 has a reduced portion 134 forwardly of a larger rear portion 136. The enlarged portion 136, provided as gold plated brass in one form of the invention, stops short of bend location 137 in the bent configuration of the probe tip 102, while the reduced size guard portion 134 continues forwardly angled along the bend location 137 to the end 118 thereof. By way of example and not limitation, the reduced size guard portion 134 can extend about 0.5 inches from the end 118 to the bend location 137, and about 0.25 inches from the bend to end wall 184 of the enlarged portion 136. In this manner, the guard member 116 provides enhanced electrical performance by providing isolation from electrical conditions creating measurement inaccuracies and, at the same time, provides a rigid and robust mounting for the forward conductor 122, and in particular the small projecting portion 124 thereof while still affording substantially unimpeded view of the tip end 120 as it is manipulated and is placed onto the test site 108 due to the reduced size portion 134 of the guard member 116. In addition, because the portion 134 only slightly increases the effective diameter of the probe tip 102 about the projecting portion 124 thereof, it easier to use the present probe assembly 100 in close proximity to other like assemblies 100 that are used for testing of multiple sites 108 on a single DUT 110. By way of example and not limitation, the outer diameter of the guard portion 134 can be approximately 0.035 inch. The metal material of the guard member 116 provides the probe tip 102 with rigidity and robustness along substantially its entire length and thus minimizes instances of breakage of the projecting portion 124 such as can be caused by impacting the distal tip end 120 against the DUT 110 or surrounding surfaces. The rigidity provided by the guard member 116 also helps stabilize the probe 100 to maintain proper contact of the distal tip end 120 uniformly against the test site 108. The stiffer probe tip 102 provided by the long metallic guard member 116 also minimizes vibrations that otherwise may be induced in the assembly 100 by the test environment.

As previously discussed, one of the main advantages afforded by the detachable connection 104 is the ability to quickly and easily exchange probe tips 102 or reconfigure a dull tip end 120 thereof as by sharpening in a quick and easy manner. The detachable connection 104 herein does not require the use of tools for changing out the probe tip 102 for replacement or maintenance thereon. Instead, the detachable connection 104 employs a sliding fit between the probe tip 102 and probe holder 106 that allows a user to simply pull the tip 102 out from the holder 106 or slide the tip 102 back therein. At the same time, the detachable connection 104 maintains a consistent and reliable pathway for signal travel along the forward conductor 122 of the probe tip 102 and a rearward conductor 138 of the holder 106. In other words, the forward conductor 122 and rearward conductor 138 are provided with an interface 139 (FIG. 27) that minimizes any conductivity degradation therebetween despite the removability of the tip 102 from the holder 106.

Figure 25:
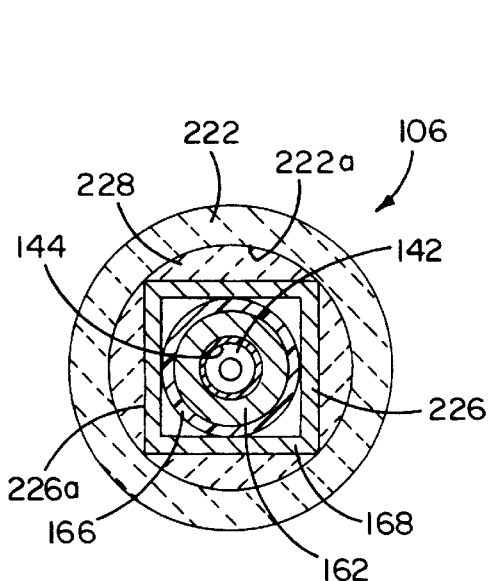
FIG. 25 is a cross-sectional view taken along line 25—25 of FIG. 20, showing a forward tubular portion of the probe holder center conductor for receiving the plug portion of the probe tip center conductor with the probe tip square guard portion received in probe holder guard socket opening to provide a detachable connection between the tip and holder.
Figure 24:
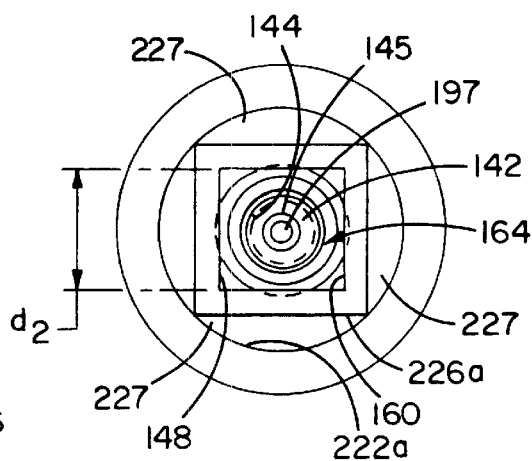
FIG. 24 is a front end elevational view of the probe holder taken along line 24—24 of FIG. 20 showing the square configuration of a socket opening in the holder guard conductor and a forward mouth opening formed in the probe tip center conductor.
Figure 27:
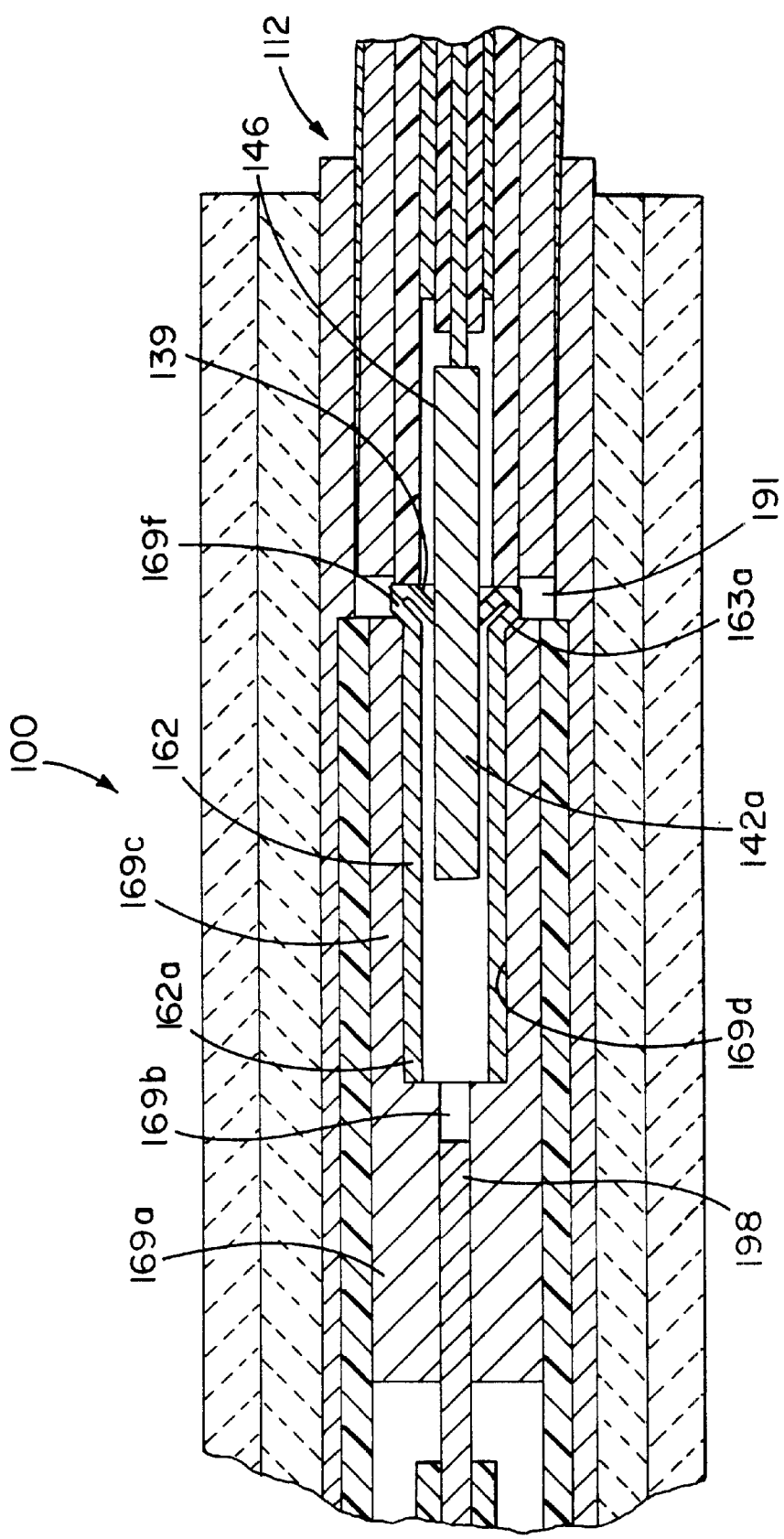
FIG. 27 is a sectional view of the probe assembly showing the probe holder of FIG. 20 and the probe tip of FIG. 21 attached together via the detachable connection with the plug portion of the probe tip center conductor received in the opening of the holder center conductor via the mouth thereof.

More particularly, the forward conductor 122 can include a rear plug portion 140 formed of tungsten, and the rearward conductor 138 includes a mouth through opening 141 leading to an elongated opening 142, as best seen in FIGS. 20 and 21. Like the forward conductor 122, the rearward conductor 138 is of conductive material such as a tungsten, metallic material. The mouth through opening 141 is relatively small and widens to the opening 142 which is centrally disposed in tubular portion 162, which in one form of the invention is gold plated brass welded to one end of rearward conductor 138, as described more fully herein. The rear plug portion 140 is sized so that it has a friction fit when received in the mouth opening 141 with the portion 140*a* received in the elongated opening 142 of tubular portion 162 and having a slight clearance fit therewith, as can be seen in FIG. 27. As shown in FIGS. 24 and 25, the mouth through opening 141 and the elongated opening 142 can have annular surfaces 143 and 144, respectively, extending thereabout. Similarly, the conductor rear portion 140 has an annular outer surface 146 that has a diameter slightly larger than that of surface 143 and slightly smaller than that of the surface 144. Accordingly, with the rear plug portion 140 slid through the mouth opening 141 into the elongated opening 142, there will be intimate contact between the forward conductor surface 146 and the rearward conductor surface 143 at the engagement interface 139 therebetween to provide a consistent and reliable pathway for the electric signals formed by the conductors 122 and 138, as will be described in more detail hereinafter.

Referring to FIG. 24, the detachable connection 104 can further include a socket opening 148 for receipt of a portion of one of the electrical conductors of the probe assembly 100. In the preferred and illustrated form, the socket opening 148 is formed in guard member 150 associated with the probe holder 106 at the forward end thereof, and the corresponding portion adapted to fit in the socket opening 148 is the enlarged portion 136 of the probe tip guard member 116 to provide an electrical connection between the guard members 116 and 150. Like the probe tip guard member 116, the holder guard member 150 is of conductive material, such as a gold plated brass, metallic material. Accordingly, the electrical controls energize the tip guard member 116 by way of the holder guard member 150 for maintaining the guard conductor 116 at or near the same potential as the signal conductor 122 to minimize leakage currents and reduce measurement errors.

As best seen in FIG. 20, the socket opening 148 is at the forwardmost end of the probe holder 106 and leads to the tubular portion 162 recessed within the holder 106. The rear plug portion 140 of the forward conductor 142 extends beyond the rear end 152 of the enlarged guard portion 136 so that with the portion 136 fit in the socket opening 148, the conductor portion 140 can be received through the mouth opening 141 with portion 140*a* in the elongated opening 142, as previously described. Accordingly, the socket opening 148 is formed in socket portion 154 of the holder guard member 150. Preferably, the socket portion 154 has a cross-sectional configuration that is other than circular and the guard portion 136 of the probe tip 102 has a complimentary cross-sectional shape for being received within the socket 148 by a non-rotational mating fit therebetween. As can be seen in FIG. 22, the guard portion 136 has a polygonal configuration in the form of a square with side walls 156. Parallel side walls 156 have flat outer surfaces 158 that are spaced at a distance $d_1$ that is slightly smaller than distance $d_2$ across parallel inner-surfaces 160 in the socket opening 148 of the guard member socket portion 154, as shown in FIGS. 22 and 24. Thus, when the enlarged portion 136 of the tip guard member 116 is received in the opening 148 of the socket portion 154 of the holder guard member 150, the probe tip 102 will be restricted from rotation via the confronting flat surfaces 158 and 160.

In the illustrated and preferred form, thin layers 159 of a conductive material such as solder are deposited on opposite upper and lower surfaces 158, preferably such that they progressively increase in thickness toward the large guard portion end wall 184, as seen best in FIG. 21. Referring to FIG. 27, it can be seen that the solder layers 159 cause the guard portion 136 to be received in the guard member socket portion 154 as by a slight friction fit between the layers 159 and the corresponding opposing upper and lower socket opening inner surfaces 160.

Continuing reference to FIGS. 20 and 25, the rearward conductor 138 has the elongated opening 142 formed in the forward tubular portion 162 thereof, as previously discussed. The conductor-tubular portion 162 terminates at its forward mouth end wall portion 163 adjacent the rear of the socket 148 so as to form an abutment surface 164 thereat More specifically, and referencing FIG. 29 which shows a modified probe tip portion 102 to be described hereinafter, the mouth end wall portion 163 is bent over so that it extends radially inward and rearward from the end surface 164 to an inner free end 165 along inner inclined surface 167. Accordingly, the inclined surface 167 extends to the mouth surface 143 and defines a recess 167a leading to mouth through opening 141 which, in turn, opens to the elongated opening 142. The inclined surface 167 serves to guide the forward conductor plug portion 140 to the mouth opening 141 in the likely event it is not perfectly aligned therewith when the tip portion 102 is being attached to the probe holder 106. In addition, the bent over end wall portion 163 is resiliently flexible so that at its free end 165, it will deflect as the larger rear plug portion 140 of the forward conductor is slid through the smaller mouth opening 141. In this manner, the mouth surface 143 resiliently engages along the plug portion surface 146 to form a reliable and secure interface 139 therebetween. In other words, the resilient engagement between the rearward conductor 138 of the probe holder 106 and the forward conductor 122 of the detachable probe tip 102 as described above provides a low resistance ohmic contact at the interface 139 therebetween which ensures electrical continuity thereat for maintaining accuracy of the low level measurement to be taken with the present probe assembly 100. Further, the resiliency of the free end 165 minimizes the force of the scraping action along the plug portion surface 146 and thus against the conductive material thereon important over repeated tip portion 102 replacement operations.

Referring to FIG. 27, a conductive member 169 receives the tubular portion 162 therein. As shown, the conductive member 169 has thicker wall rear base portion 169a having a small diameter central through opening 169b formed therein, and thinner wall forward portion 169c defining receiving bore 169d. A shoulder abutment surface 169e is defined at the juncture of the wall portions 169a and 169c. The tubular portion 162 is fit in the receiving bore 169d and bottoms into engagement at its rear end 162a against shoulder abutment surface 169e and is attached as by soldering in the bore 169d.

The mouth end wall portion 163 preferably is enlarged relative to the tubular wall portion 162. In this regard, the end wall portion 163 includes an outer inclined surface 163a that can be generally parallel to inner inclined surface 167 and radially outward and rearward therefrom. Further, the thin wall portion 169c of the conductive member 169 is beveled as at 169f to present an engagement surface against which tubular end portion inclined surface 163a abuts with tubular portion rear end 162a against the shoulder surface 169e, as previously described.

The abutment surface 164 has an annular configuration and is disposed radially inward from inner surface 160 of the socket portion 154 of the holder guard member 150. The conductor-tubular portion 162 and attached conductive member 169 are separated from the holder guard member 150 by way of an intervening insulator member 166 in the form of a dielectric material, such as Teflon. The holder guard member 150 has a thin annular wall section 168 that extends rearwardly from the socket portion 154 and forms an annular pocket 170 in cooperation with the attached conductor-tubular portion 162 and member 169 into which the forward end of the insulator member end 166 is received. A small end portion of the insulator member 166 is exposed radially inward beyond the guard socket portion 154 at the rear end of the socket opening 148 so as to cooperate in forming the abutment surface 164 at the forward end of the tubular portion 162.

As previously mentioned, the rear end 152 of the probe tip guard member 116 stops short of the projecting plug portion 140 of conductor 122. As can be seen in FIGS. 21 and 23, the projecting plug portion 140 is centrally disposed in space 172 of the tip 102 and spaced from the walls 156 of enlarged portion 136 of the guard member 116. An intervening insulator member 174 is engaged against inner surfaces 176 of the guard member side walls 156, as best seen in FIG. 22. The insulator member 174 is of an insulative or dielectric material, such as Teflon.

In the preferred and illustrated form, the insulator member 174 has an annular configuration and thus contacts the inner surfaces 176 of the guard member walls 156 at intermediate positions along their width. Further, there is a gap 178 between the plug portion 140 and the insulator member 174. More specifically, annular wall 180 of the reduced guard portion 134 extends into the space 172 defined by the walls 156 of the guard member portion 136 via a central aperture 182 formed in end wall 184 of the guard member portion 136, as best seen in FIG. 21. The wall 180 is in engagement with the end wall 184 as it extends through the aperture 182 so as to electrically connect the guard portions 134 and 136. The guard portion 134 is preferably of a gold plated copper material and the guard portion 136 is preferably of a gold plated brass material. Between the guard member wall 180 and the probe tip center conductor 122 is insulating member 186 which also extends through the aperture 182 into the space 172 of guard member portion 136. The insulating member 186 extends slightly further rearwardly in the space 172 than does the guard member annular wall 180 with both axially overlapping the insulating member 174 such that the wall 180 is engaged thereagainst. The insulating member 186 is of an insulative or dielectric material, such as Teflon. The overlapping region of the insulating members 174 and 186 is beneficial in terms of ensuring electrical isolation exists between the forward conductor 122 and the guard portions 134 and 136.

The plug portion 140 is preferably enlarged relative to thin, wire portion 187 of the center conductor 122 that extends forwardly and includes the conductor projecting portion 124, as shown in FIGS. 21 and 23. In this manner, the diameter across the surface 146 of the plug portion 140 is greater than that of the wire portion 187 to provide an interference with the size of mouth opening 141. The diameter across the surface 146 of the plug portion 140 is approximately the same as that of the insulator member 186 extending about the conductor wire portion 187. Thus, the size of the gap 178 as measured by the distance from the outer surface 146 of the conductor plug portion 140 to the insulator member 174 is approximately the same as the thickness of the annular wall 180 of the guard member 116.

The insulator member 174 has a rear end 188 that extends slightly rearwardly past the end 152 of the guard member portion 136. The insulator member 174 extends forwardly in the space 172 in axially overlapping relation to the guard member wall 180, insulator member 186 and conductor 122 and terminates spaced from the guard member end wall 184 so that only air gap 190 intervenes between the guard member wall 180 and the guard member side walls 156 adjacent the end wall 184 of the guard member portion 136 and forwardly of the insulator member 174.

The conductor plug portion 140 extends for a predetermined length rearwardly beyond the ends 152 and 188 of the guard member portion 136 and insulator member 174, respectively. Referring to FIG. 27, when the probe tip 102 is attached to the probe holder 106 via the detachable connection 104, the end surface 188 serves as a stop surface to limit the depth of insertion of the conductor plug portion 140 into the elongated opening 142 of the rear conductor tubular portion 162. In this regard, when the stop surface 188 of the insulator member 174 is fully slid into the socket opening 148 so as to engage against abutnent surface 164, the predetermined length of the conductor plug portion 140 will be fit into the rear conductor tubular portion 162. In this manner, when probe tips 102 are removed from the probe holder 106 and replaced with new and/or reconfigured probe tips 102, the depth of insertion of the plug portion 140 into the tubular portion 162 can be consistently achieved. Accordingly, the present detachable connection 104 generally provides for repeatable placement of the probe tip 102 relative to the holder 106 and, in particular, provides a consistent interface 139 in terms of the relative general location of the surface contact between the forward conductor 122 of the probe tip 102 and the rearward conductor 138 of the probe holder 106 via the respective plug portion 140 and mouth surface 143 of the tubular portions 162 thereof. As shown with the tip portion 102 fully mated in the holder 106, there is an insulation air gap 191 between the end 152 of the tip guard member portion 136 and the attached tubular portion 162 and conductive member 169, at the forward ends thereof. Accordingly, when engaged against abutment surface 164, the insulator 174 also spaces the guard portion 136 from the tubular portion 162 of rearward conductor 138 to maintain electrical isolation between the rearward conductor 138 and the probe tip guard member 116.

An alternate and preferred form of the probe tip portion 102 is shown in FIGS. 28 and 29. In this form, the forward conductor 122 includes a biased member 300 at its rear end that is urged through mouth opening 141 and into the elongated opening 142 of the rearward conductor tubular portion 162. The biased member 300 is sized in a similar manner to conductor rear portion 140 of the previously described version of the tip portion 102 in that it is slightly larger than the mouth opening 141 so when inserted therein, the free end 165 will deflect so that the mouth surface 143 resiliently engages the member 300. In addition, the biased member 300 is urged axially rearward and into the tubular portion 162 as by bias member 302.

Accordingly, while the bias force provided to conductor member 300 by the free end 165 has an axial component in the forward direction, the bias member 302 provides a counteracting axial bias force in the rearward direction with the mouth surface 143 and conductor member 300 biased oppositely and toward contact with one another so that at the engagement interface 139 between the mouth surface 143 and the conductor member 300, there will be consistent, secure and intimate contact therebetween. The counteracting bias force provided by bias member 302 to the conductor member 300 minimizes tendency for the bias force provided by the bent over mouth end wall 163 to cause forward shifting of the member 300 and/or shifting of the mouth surface 143 forwardly toward its undeflected position. Further, any such forward shifting can be taken up by the biased member 300. In this manner, the biased member 300 can be securely and repeatably inserted into tubular portion 162 in conductive engagement therewith and without changing the position of the terminal end 120 of the forward conductor 122 relative to the probe holder 106 with the tip portion 102 attached to the probe holder 106. Further, the bias afforded member 300 provides it with some give during the tip insertion operation for easier and smoother attachment of the tip portion 102 to the probe holder 106 via the sliding fit between the member 300 and the mouth surface 143. This further minimizes the scraping action of the mouth surface 143 along the member 300 so as to limit damage to the conductive plating thereon, as described more fully hereinafter. Once the tip portion 102 is attached to the probe holder 106, there will be tight engagement of the mouth surface 143 on the member 300 due to the generally opposing bias forces as described above, thus providing the intimate contact between the forward conductor 122 and the rearward conductor 138 that avoids detrimental conductivity degradation at the engagement interface 139 therebetween.

In the illustrated and preferred form, the members 300 and 302 can be provided in a barrel-plunger assembly 304, such as provided by Interconnect Devices, Inc. of Kansas City, Kans. The assembly 304 includes a barrel housing 306 having a cylindrical side wall 308 engaged against inner surface 309 of the insulator member 174 and closed at the forwardly disposed end thereof by transverse end wall 310. The bias member is in the form of a coil spring member 302 disposed between the housing end wall 310 and enlarged end 312 of the member 300 in the housing 306 so that opposite end 314 is spring loaded to be urged axially rearward with a predetermined bias force, such as on the order of a 2 oz. spring force. Thus, the biased member is in the form of a plunger member 300 which slidingly extends into and out from open end 316 of the housing 306.

The plunger member 300 has a narrow intermediate section 318 that extends rearward from the enlarged end 312 in the housing 306. The intermediate section 318 steps up to a larger diameter rearward section 320 which extends out of the housing end 316 to the plunger end 314. As previously discussed, the diameter of the section 320 is slightly larger than that of mouth surface 143. By way of example and not limitation, the diameter of section 320 can be approximately 0.026 inch. The plunger end 314 can have a conical shape so that the plunger 300 tapers down to a point at the rear end 314 thereof. The taper of plunger end 314 in conjunction with the inclined surface 167 of the tubular portion 162 cooperate to cam against each other and centrally align the plunger member 300 relative to mouth opening 143 as it is inserted therein. At its largest diameter, the conical end 314 and the section 320 will resiliently engage against the mouth surface 143 as they slide into the elongated opening 142 until the insulator is stop surface 188 of the probe tip 102 engages against the abutment surface 164 on the tubular portion mouth wall 163.

The barrel plunger assembly 304 is conductively attached to the forward center conductor wire portion 187 at rear end 187*a* thereof via a solder joint thereat. The components of the assembly 304, namely the plunger 300, the spring 302 and the barrel housing 306 are all of conductive material and are preferably gold plated so that there is little contact resistance at their engagement surfaces. For example, the material of the plunger 300 can be a brass material, the material of the spring member 302 can be a stainless steel material, and the material of the housing 306 can be a nickel or silver material so as to provide high conductivity between the rear conductor tubular portion 162 and the forward conductor wire portion 187 via the barrel plunger assembly 304.

The plunger housing 306 can be crimped along the length of its sidewall 308 as at 322. The crimping of the wall 308 provides radial clearance to plunger intermediate section 318 for sliding in the housing 306 while blocking the enlarged plunger end 312 from advancing in the rearward direction past the crimped location 322 under the influence of the bias force of the spring member 302 thus maintaining the plunger member 300 captive in the housing 306 and limiting the travel distance of the plunger member 300 out from the housing end 316.

More of the details of the holder 106 of present probe assembly 100 will next be described with particular reference to FIGS. 20 and 24–26. To provide the maximum accuracy in low current test measurements, it is preferred that the probe holder 106 have a triaxial configuration. Accordingly, in addition to the holder guard member 150, shield member 114 of conductive material extends about the outer periphery of a portion of the length of the holder 106. The shield member 114 is insulated from the radially inwardly disposed holder guard member 150 via at least one intervening insulator member. The shield member 114 may be electrically connected to ground potential to shield against external noise sources, such as currents induced by electromagnetic interference.

The rearward conductor 138 includes a thin, wire portion 194 that is electrically connected to the conductor tubular portion 162 via the conductive member 169. More specifically, forward end 198 of the conductor wire 194 is inserted in the through opening 169*b* of the conductive member base portion 169*a* and soldered therein. To maintain good conductivity at the joint between the rear conductor wire 194 and the rear base portion 169*a*, the solder weld is preferably nickel-plated.

The insulator member 166 and guard thin wall section 168 extend rearward beyond the conductor base wall portion 169*a* and abut against a guard ring 200 through which the rear conductor wire 198 extends. The conductor wire 198 is encased with insulator member 202 spaced rearwardly of the conductor base wall portion 169*a* and extending through the guard ring 200. The insulator member 202 is of an insulative or dielectric material, such as Teflon. To continue the guarding for the probe assemble 100 rearwardly of the guard ring 200, the holder guard member 150 includes guard portion 204 that extends about the insulator member 202. The guard portion 204 has its forward end between the guard ring 200 and the forward end of the insulator member 202 and extends rearwardly through the guard ring 200 in engagement therewith so as to be electrically connected thereto. An insulator member 206 extends about the guard portion 204 rearwardly of the guard ring 200 for insulating it from the shield member 114. The insulator member 206 is of an insulative or dielectric material, such as Teflon.

The shield member 114 can include an outer conductor portion 208 of conductive material, such as a gold plated brass. The outer conductor portion 208 can have a stepped configuration with an enlarged rear section 210 and a reduced thickness annular forward section 212. The shield member 208 further includes an annular inner conductor portion 214 engaged against the outer surface of the insulator member 206 and the inner surface of the enlarged section 210 of the outer conductor portion 208 to be electrically connected thereto. The inner conductor portion 214 cooperates with the stepped conductor portion 208 to form an annular pocket 216 into which an insulator member 218 is received. The insulator member 218 is of an insulative or dielectric material, such as ceramic.

Referring to FIG. 20, the forward section 212 of the shield outer conductor portion 208 stops at its forward end 213 axially rearward of the guard ring 200. Similarly, the inner conductor portion 214 of the shield member stops short of the guard ring 200 at its forward end spaced slightly axially rearward of the end 213 of the outer conductor portion 208. The insulator member 218 includes a small diameter annular rear section 220 that is received in the annular pocket 216. As the forward section 212 of the outer conductor portion 208 does not extend the entire length of the probe holder 106, the insulator member 218 jogs radially outward to a larger diameter annular forward section 222 via a shoulder portion 224 thereof. The outer diameter of the shield conductor portion 208 and the insulator forward section 222 are the same so that with the small diameter rear annular section 220 fully received in the pocket 216, the forward end 213 of the shield conductor portion section 212 will abut against the insulator shoulder portion 224 to present a smooth outer surface 225 for the probe holder 106 spanning the joint between the shield member 114 and the insulator member 218.

This disclosed arrangement of a guard and shield members relative to each and to the distal end of the probe tip provides highly effective guarding of the low level currents applied and measured via the forward conductor 122 of the probe tip 102 and the rearward conductor 138 of the probe holder 106. Thus, with reference to FIGS. 20 and 21, the probe tip guard member 116 and holder guard member 150 extend generally along the length of forward conductor 122 and rearward conductor 138, spaced radially between the forward and rearward conductors 122 and 138 and shielding member 114. The exposed projecting portion 124 of forward conductor 122 is spaced from shielding member 114 along longitudinal axis 125*a*. The distance provided between the projecting portion 124 of the probe tip and the shielding members of the probe holder reduces the system capacitance and corresponding current leakage between the projecting portion 124 of the probe tip and the conductive shielding members. By way of example, the shield member 114 may be spaced from the exposed projecting portion 124 of forward conductor 122 by about 1 inch as measured along axis 125*a*. The intervening guard members extending all the way to terminal end 118 further reduce the system capacitance and associated leakage currents by providing an electrical barrier with respect to the shielding member 114 and other conductive components of the probe station. The guard members 116 and 150 provide substantial line of sight guarding between the probe holder shield member 114 and projecting portion 124 of forward conductor 122.

Due to the preferred non-circular or square configuration for the guard socket portion 154 including the rear thin wall section 168 thereof, and the annular configuration of the insulator member 218 including the forward section 222 thereof extending about the guard portion 154, gaps are created in the area therebetween. More specifically and referencing FIGS. 24 and 25, the guard portion 154 includes walls 226 having flat outer surfaces 226a. The insulator forward section 222 includes an annular inner surface 222a facing the guard member outer surfaces 226a. As shown, the outer surfaces 226a have a width so that at corners therebetween, the guard member walls 226 are engaged against the insulator section surface 222a. This arrangement creates four distinct gap areas 227 bounded by the insulator surface 222a and the guard surfaces 226a. These areas 227 are preferably filled with an insulative material 228 that is flowable, such as a ceramic paste material. The ceramic paste material can be directed into the gaps between the surfaces 222a and 226a so as to substantially fill the entire volume of the space therein. The material will set up and harden so that insulating material extends substantially continuously along the axial length of the guard portion 154 and radially outward therefrom to the outer surface of the ceramic insulator 218, as shown in FIG. 21. More specifically, a ceramic powder is mixed with water to form a paste which is forced into the gaps. After a curing period of about 12 hours, the assembly is baked at approximately 200° F. for about 12 hours to remove residual moisture and form a solid ceramic material in the gaps.

As shown in FIG. 19, the probe assembly 100 of the invention has a main horizontal section 125 that extends along longitudinal axis 125a and a rear section 127 that extends upward at an angle B to the axis 125a. By way of example and not limitation, the angle B can be approximately 65°. The angled section extends to an integral connector assembly 236 which provides an electrical connection to the female connector 237 of a triaxial cable 239 for electrically connecting the probe assembly 100 to test instrumentation. Connector assembly 236 includes a conductive outer body 242, which is made of a conductive metal such as gold plated brass. The conductive outer body 242 includes threads 238 on its outer surface at an end thereof adjacent shoulder 240 for mating with the connector 237 of triaxial cable 239. Shank 230 extends from the connector assembly 236 in a direction approximately parallel to longitudinal axis 125a and is insertable into connector 241 of manipulator 126 for mechanically connecting the probe assembly 100 to the manipulator 126 to thereby permit precise adjustment of the probe tip end 120 relative to a test site 108 of wafer 110. The shank 230 includes shank portion 232 extending from base portion 234, and is welded to the outer body 242 of connector assembly 236 at a beveled end of the base portion 234. By way of example, and not limitation, the horizontal section 125 of probe holder 106 can extend approximately 2.375 inches in length from the terminal end of insulator member 218 to bend 280, and the rear section 127 of the probe holder 106 can extend about 1.25 inches from the bend 280 to shoulder 240.

With reference to FIG. 20, the triaxially configured assembly, including the wire portion 194, guard portion 204, and inner conductor portion 214 radially spaced by insulator member 206 and insulator 202, extends longitudinally in a direction away from socket portion 154 to thereby extend the center conductor, guard and shield components of the probe assembly back to connector assembly 236. With reference also to FIG. 19, inner conductor portion 214 of shield member 114 forms the outer surface of the probe holder as it extends past the enlarged rear section 210 of shield member 114.

Now, with reference to FIG. 30, the arrangement of components of connector assembly 236 is explained in further detail. The conductive outer body 242 has a generally tubular shape as is further apparent from the cross-sectional view thereof provided in FIG. 31. Opening 243 has a circular cross-section and is sized to receive insulator 246, which also has a generally tubular shape as shown in the cross-section view thereof in FIG. 32. The insulator 246 can be made of a dielectric material such as Teflon. When inserted into the opening 243 of conductive outer body 242, the shoulder 247 at an end of the insulator abuts against end wall 245 on the interior of conductive outer body 242.

Conductive guard member 250 is also of a generally tubular shape as shown in the cross-sectional view thereof in FIG. 33, and includes a main body portion 254 and a narrow portion 252 which extends from the main body portion at shoulder 253. The guard member is formed of a conductive metal such as gold plated brass. The guard member is insertable into the central passageway of insulator 246 until the shoulder 253 abuts against end wall 249 on the interior of the insulator 246. In this arrangement, the insulator 246 electrically isolates the conductive outer body 242 of connector assembly 236 from guard member 250. The opening 251 of circular cross-section in the main body portion 254 of guard member 250 is sized to receive tubular conductive member 256, a cross-sectional view of which is shown in FIG. 34. The outer surface of the connector 256 is welded to the inner surface of the guard member 250 in the opening 251. A slot 255 is present in the side wall of the main body portion 254 of the guard member 250 to facilitate welding the connector 256 thereto. The inner annular channel of the tubular conductive connector 256 is sized to receive insulator tube 248, which is shown in cross-section in FIG. 35. A signal conductor assembly 258 includes signal pin 260, crimp member 262 and wire portion 194. The signal pin is formed of a conductive metal such as gold plated tungsten and forms the center conductor of connector assembly 236. Crimp member 262 may be in the form of a stainless steel tube which receives the signal pin 260 at one end and the wire portion 194 at the other end. As shown in FIGS. 30 and 36, the free end 195 of the wire portion 194 is folded back on the wire portion. The signal pin 260 and wire portion 194 are secured in the crimp portion by crimping or swaging the outer surface thereof to thereby mechanically and electrically connect the signal pin to the wire portion 194.

The wire portion 194 of the signal conductor assembly thus described inserts into and extends through the insulator member 202 of coaxial tube 264, which includes a conductive copper outer casing which forms guard portion 204 shown in FIGS. 20 and 30. Insulator member 202 electrically isolates the conductive wire portion 194 of the signal conductor assembly from the guard portion 204. As shown in FIG. 20, the wire portion 194 and the coaxial tube 264 extend along the length of the probe holder 106 through the guard ring 200 and toward tubular portion 162 to which the wire portion 194 is welded, as described above. When assembled, the crimp member 262 abuts against insulator member 202 of the coaxial tube 264. The signal pin 260, crimp member 262 and a portion of the coaxial tube 264 are inserted within the internal annular passageway of the insulator tube 248. Tubular connector 256 is positioned about the coaxial tube 264 such that the inner surface thereof contacts the outer surface of guard portion 204 and the outer surface thereof contacts the inner surface of the main body portion of guard member 250 to thereby form an electrical connection between guard member 204 and guard member 250. In this manner, current applied by the test instrumentation to the guard member 250 by the triaxial cable 239 flows through the connector 256 to the guard portion 204 of coaxial tube 264, and to the guard ring 200 shown in FIG. 20. As previously described, the guard member 150 carries the guard current forward to socket portion 154, which interfaces with the large rear guard portion 136 of probe tip portion 102 for transmitting the guard current to the small diameter forward portion 134 for providing effective guarding of the forward conductor 122 at the test site.

Coaxial tube 272 includes insulator member 206 formed of a dielectric material such as Teflon and a conductive outer casing, formed of a metallic material such as copper, which is referenced in FIG. 20 as inner conductor portion 214 of shield member 114. The free end of coaxial tube 272 shown in FIG. 30 inserts into the annular opening of insulator 246 such that the insulator covers a portion of the conductor 214. Conductive spacer 244 has a tubular shape as shown in the cross-sectional view thereof in FIG. 36. The spacer 244 is positioned about coaxial tube 272, and the inner surface thereof contacts and is welded to conductive portion 214. The outer surface of the spacer 244 contacts and is welded to the inner surface of the tubular opening of the conductive outer body 242 of connector assembly 236 to thereby electrically connect the outer body 242 to the coaxial tube 272. In this arrangement, the inner conductive portion 214 and outer conductive portion 208 of shield member 114 are electrically connected to the outer body 242 of connector assembly 236, for connection to the outer conductor of the triaxial cable 239.

Thus, the connector assembly 236 is triaxially configured with a central signal conductor and electrically isolated guard and shield conductors. The probe holder of the probe assembly of the invention carries these triaxially arranged conductive members forward to provide effective guarding along the length of the probe holder and also shielding for a desired portion of the length of the probe holder. The coaxially configured probe tip portion 102 of the probe assembly carries the guard members forward to a point in close proximity to the distal tip end 120 of the center conductor to provide highly effective guarding at the test site and thereby improve the accuracy of low current and low voltage measurements made using the probe assembly. In the preferred form of the invention, the shield member 114 does not extend along the length of the probe tip portion 102 of the probe assembly such that the system capacitance and corresponding current leakage between the shield member 114 and the projecting portion 124 of the probe tip are reduced. For certain applications, it may be desirable to extend the shield member 114 further for substantially the full length of the probe holder 106 about the outer surface of the insulator member 218. However, sufficient distance should be provided between the terminal end of the shield member and the projecting portion 124 of the probe tip to control the system capacitance to an acceptable level for the test being conducted.

Figure 38:
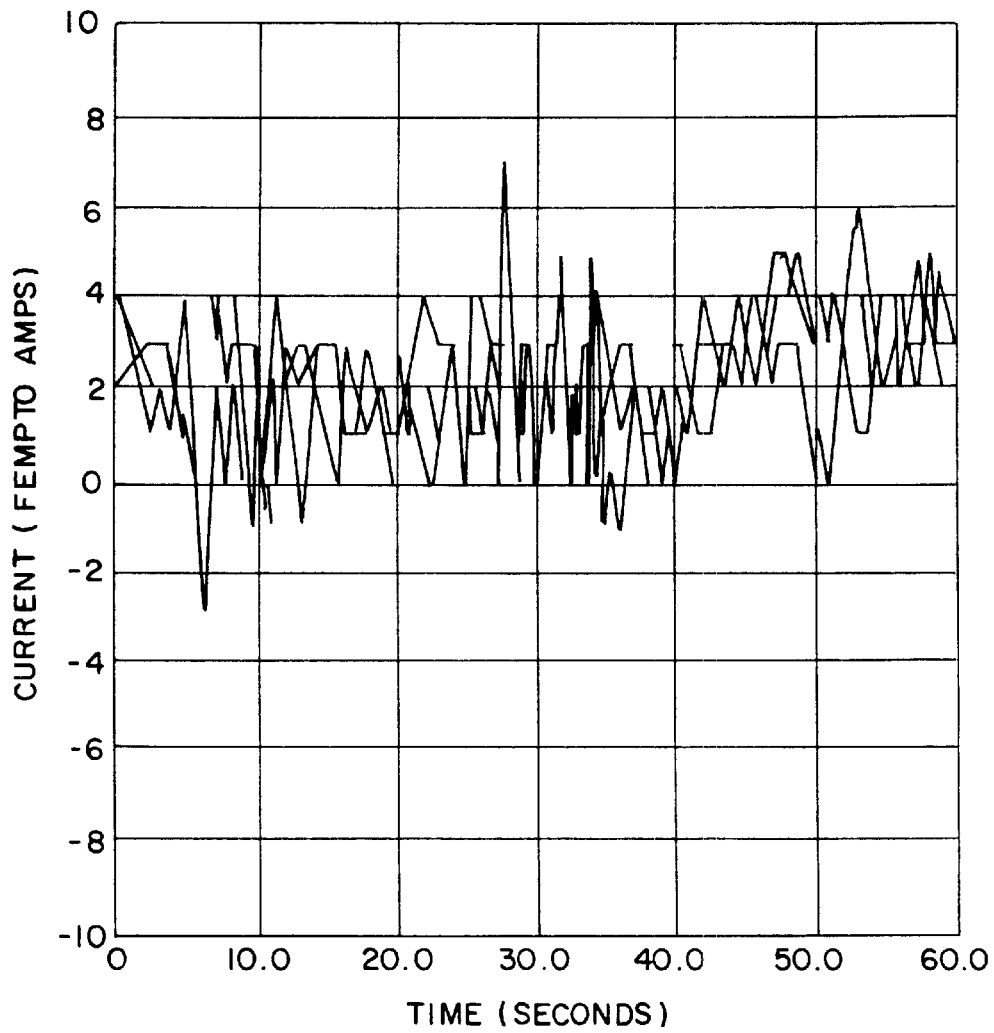
FIG. 38 graphically illustrates a leakage current associated with the probe assembly of FIGS. 18 through 35.

Experimental tests were performed to verify the operational characteristics of the probe apparatus of the invention to illustrate the advantages of incorporating the electrically isolated guard member 116 extending near the distal tip end 120 of the forward conductor 122 of probe tip 102. FIG. 38 is a graph showing the leakage current associated with the probe assembly of the invention. The distal tip end 120 is held approximately ½ inch above the chuck surface and a voltage of approximately ten (10) volts is applied to the forward conductor 122 for sixty (60) seconds. Graphs of the measured leakage current versus time of three such consecutive tests are superimposed in FIG. 38. The associated leakage current, as determined by the mean value of the measured currents, is on the order of 1 femtoampere, which is substantially lower relative to previous designs where the guard member does not extend near the distal end of the probe tip. The peak-to-peak noise, as indicated by the distance between opposite positive and negative peaks on the Y axis indicates a maximum variation expected between two measurements in the range of only 4 to 6 femtoamperes. The repeatability of the measurement indicated by the similar shape of the three individual curves demonstrates that there is little hysteresis in the system associated with the charging up of capacitive elements. This demonstrates the effectiveness of the guarding associated with guard member 116 extending near the distal tip end 120 of the forward conductor 122 in reducing the current leakage in effective capacitance.

Figure 39:
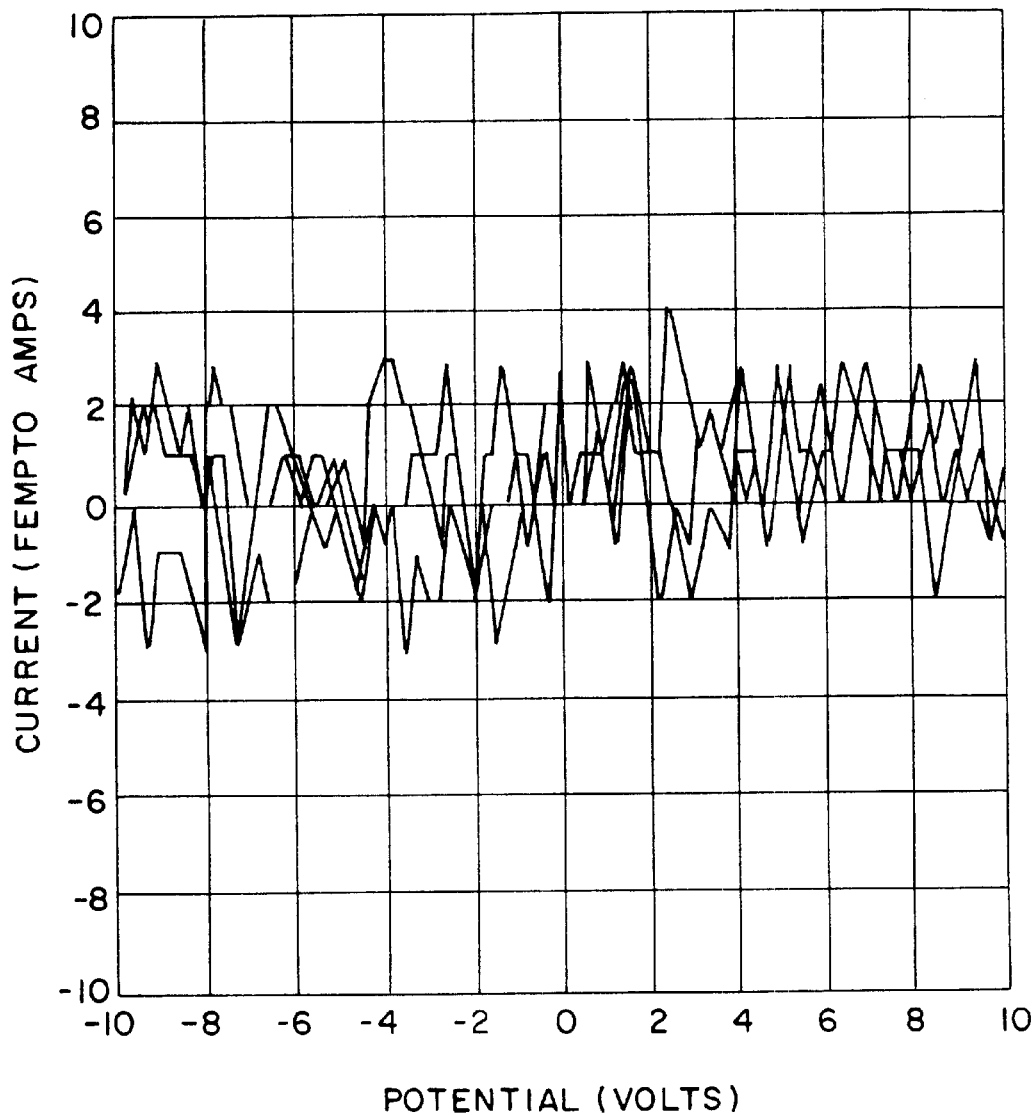
FIG. 39 shows leakage current versus applied voltage associated with the probe assembly of FIGS. 18–35.

FIG. 39 also graphically illustrates the excellent performance associated with the probe apparatus of the invention. FIG. 39 illustrates three consecutive tests in which the voltage applied to the probe tip was swept from −10 v to 10 v at 250 mv intervals. In each measurement, the slope of the graph of leakage current versus voltage is approximately zero, indicating that there is negligible capacitance between the projecting portion 124 of forward conductor 122 and adjacent conductive elements. The substantial guarding provided by the design disclosed herein has reduced the current leakage to negligible levels throughout a wide range of voltages.

Figure 40:
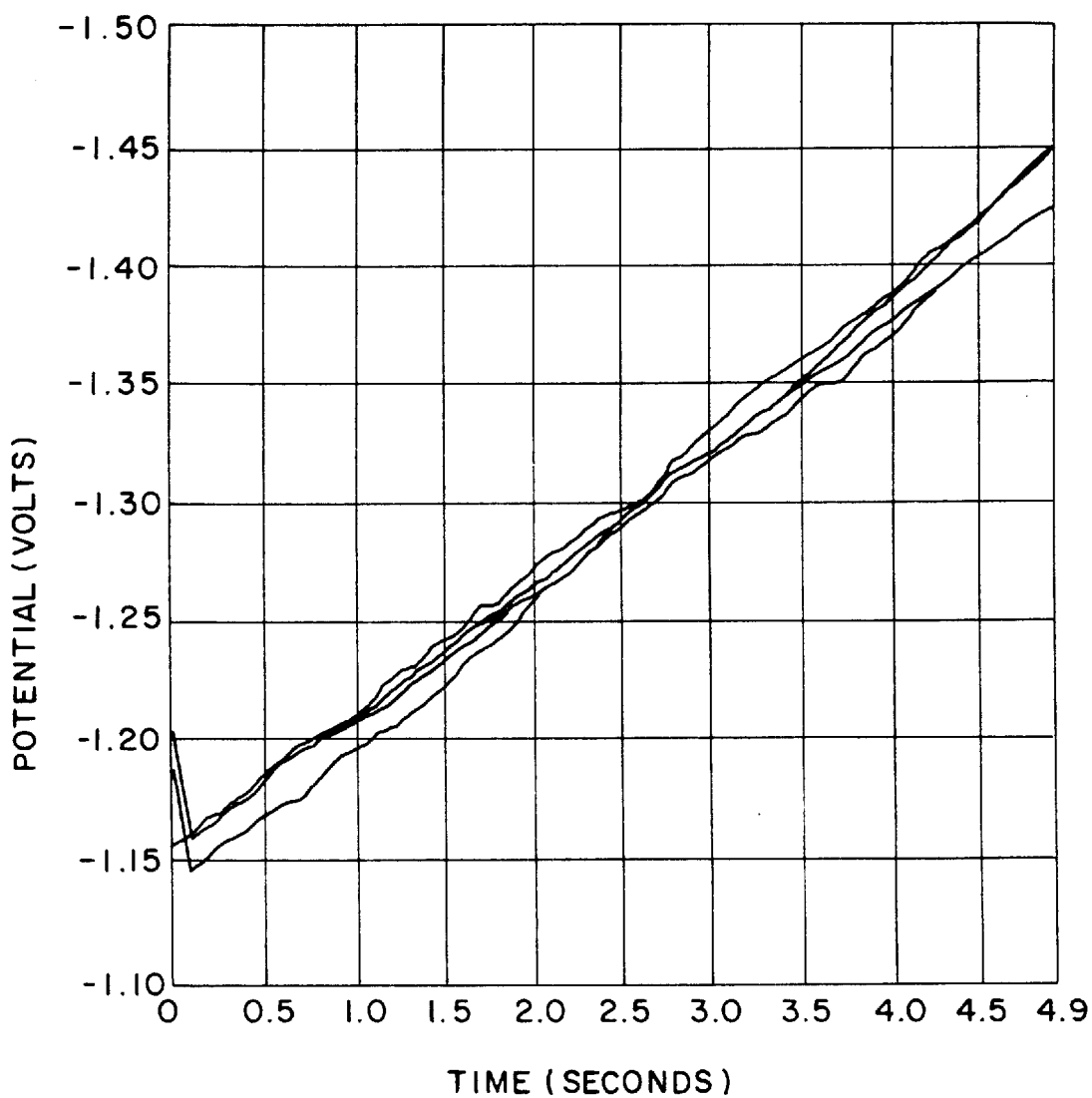
FIG. 40 graphically illustrates the capacitance measurements associated with the probe assembly of FIGS. 18 through 35.
Figure 41:
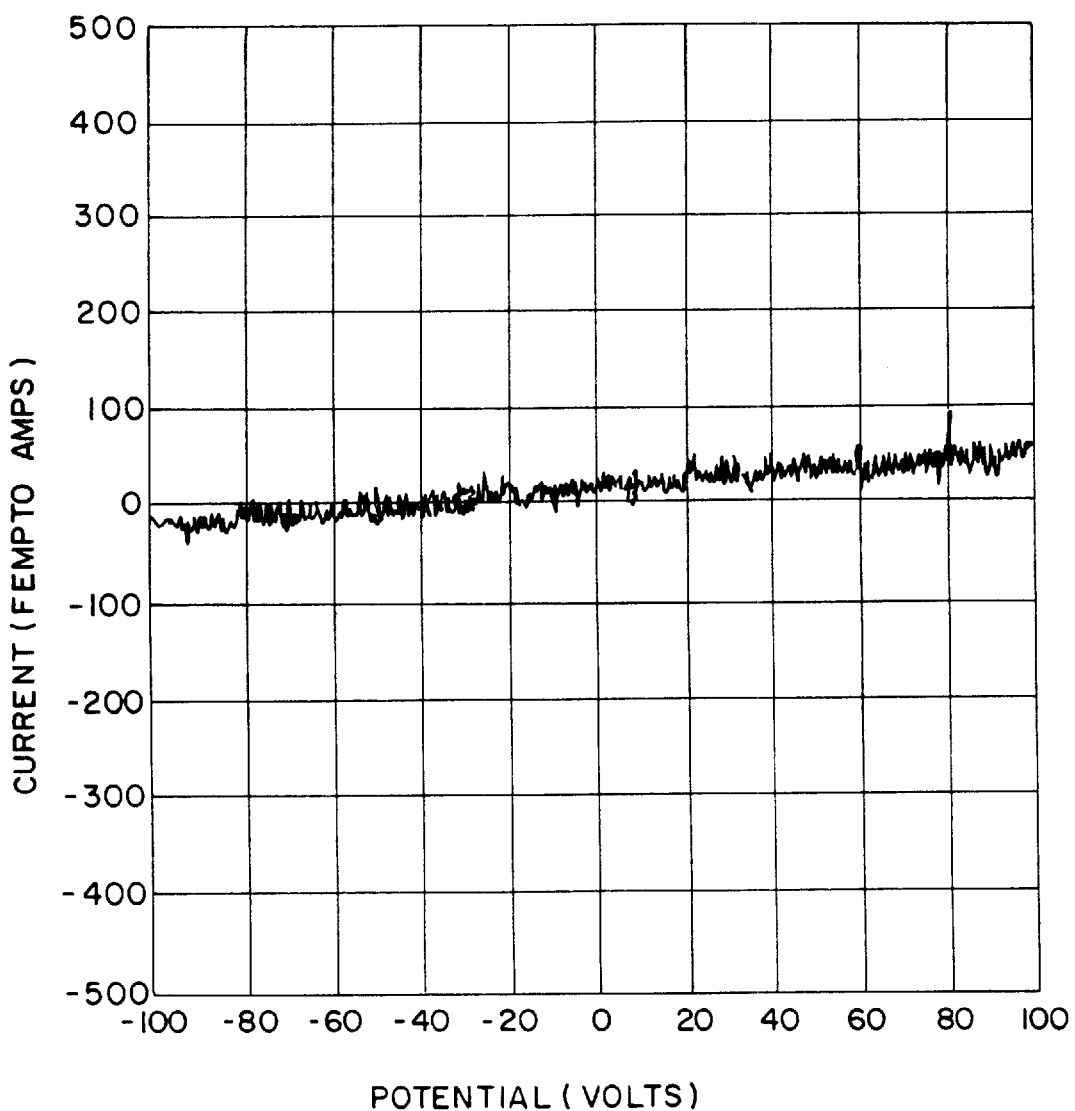
FIG. 41 graphically illustrates the hysteresis of leakage currents associated with the probe assembly of FIGS. 18 through 35.

FIG. 40 graphically illustrates the capacitance measurements associated with the probe apparatus of the present invention as measured by determining the derivative of a voltage change with respect to time. By providing sufficient distance between the projecting portion 124 of forward conductor 122 and the shield member 114 of the probe holder, and extending the guard member 116 forward near the distal tip end 120 of forward conductor 122, the measured capacitance has been reduced to less than a picofarad about 913.8 femtofarads, a substantially improved result. As illustrated in FIG. 41, the hysteresis of leakage measurements associated with the probe apparatus of the invention is also negligible. A voltage applied to the forward conductor 122 was swept from −100 v to 100 v and back, and the leakage current was measured. The negligible gap between the first curve, indicating the leakage current measured as the voltage is increased, and the second curve, indicating the leakage current as the voltage is decreased, indicates that there is almost no measurable hysteresis associated with the probe assembly. This also shows that the system capacitance has been substantially reduced by the effectiveness of the guard components associated with the design of the invention.

Figure 42:
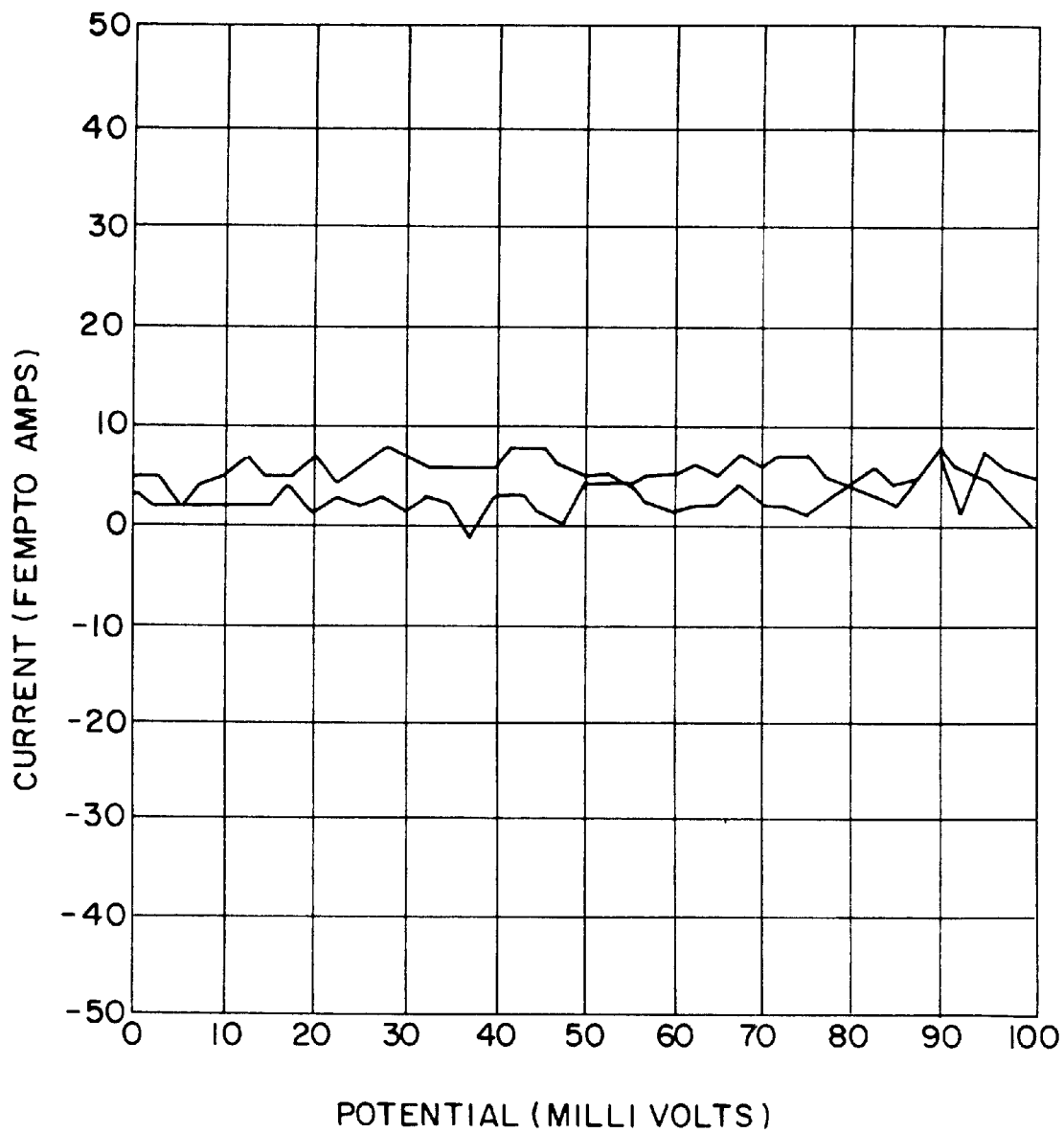
FIG. 42 graphically illustrates the settling time associated with the probe assembly of FIGS. 18 through 35.

FIG. 42 graphically illustrates the settling time associated with the system capacitance of the probe apparatus of the invention. The settling time represents the time necessary to dissipate stray currents at the probe tip when a voltage is initially applied. The lower line in FIG. 42 shows the current measured after applying an instantaneous 100 mv potential on the probe tip. The relative flatness of the curve indicates that the probe tip settled almost instantaneously. The upper curve shows similar results when a 20 mv potential was applied on the probe tip, indicating once again that capacitance effects have been substantially reduced.

Figure 43:
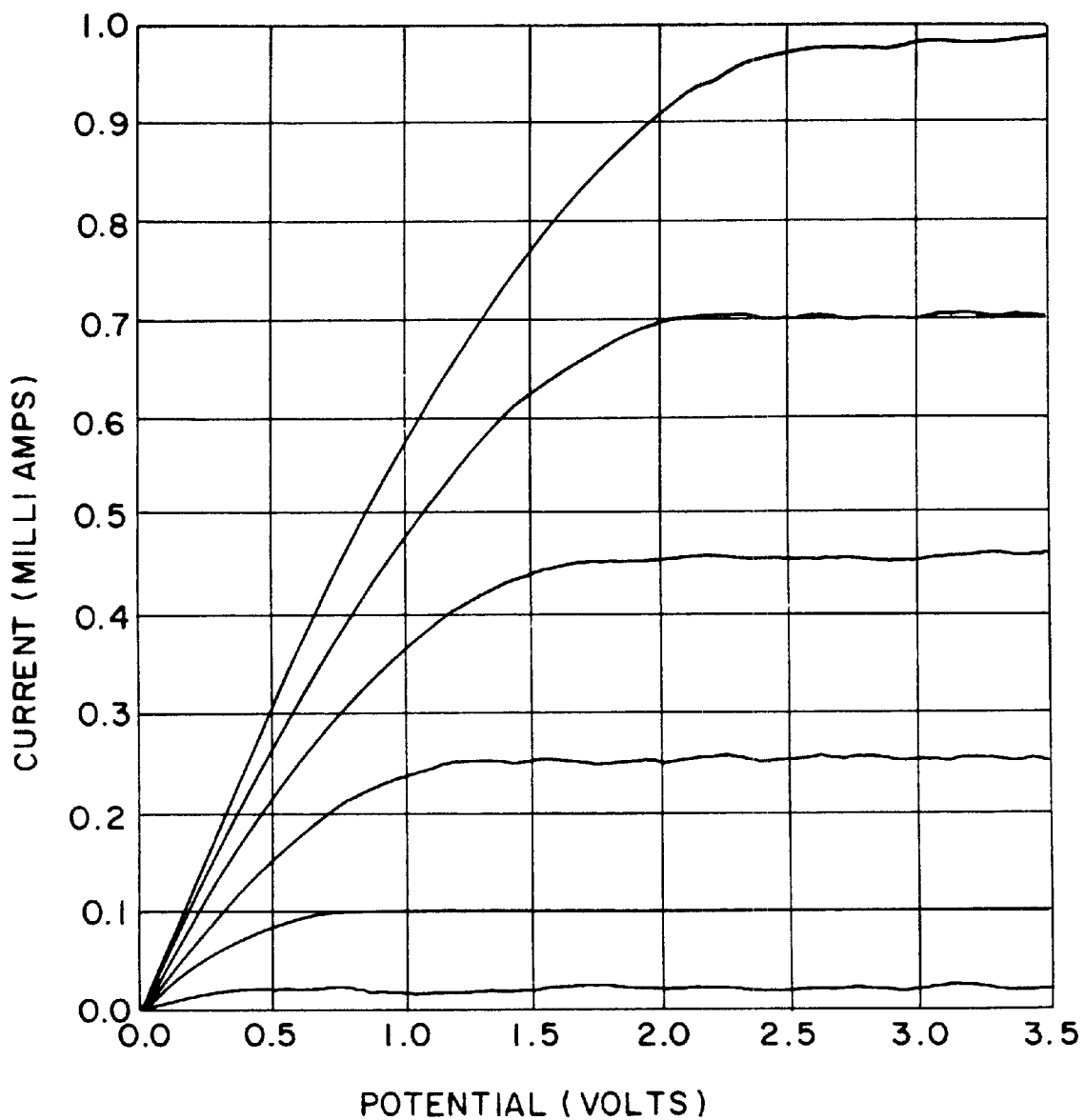
FIG. 43 illustrates the repeatability of drain current measurements of an end-channel transistor made using the probe assembly of FIGS. 18 through 35.

The probe assembly of the invention has also been shown extremely effective at making accurate and repeatable wafer measurements. FIG. 43 illustrates the results of a test designed to measure the drain current characteristics of an N-channel transistor. An initial voltage is applied to the transistor and swept over the relative range indicated on the X axis. The initial applied voltage was different in each of the five curves shown in FIG. 43. The similar shape of the five curves indicates that the measurements are very repeatable. The absence of oscillations in the flattened out portions of the curves indicates an absence of appreciable leakage currents.

Figure 44:
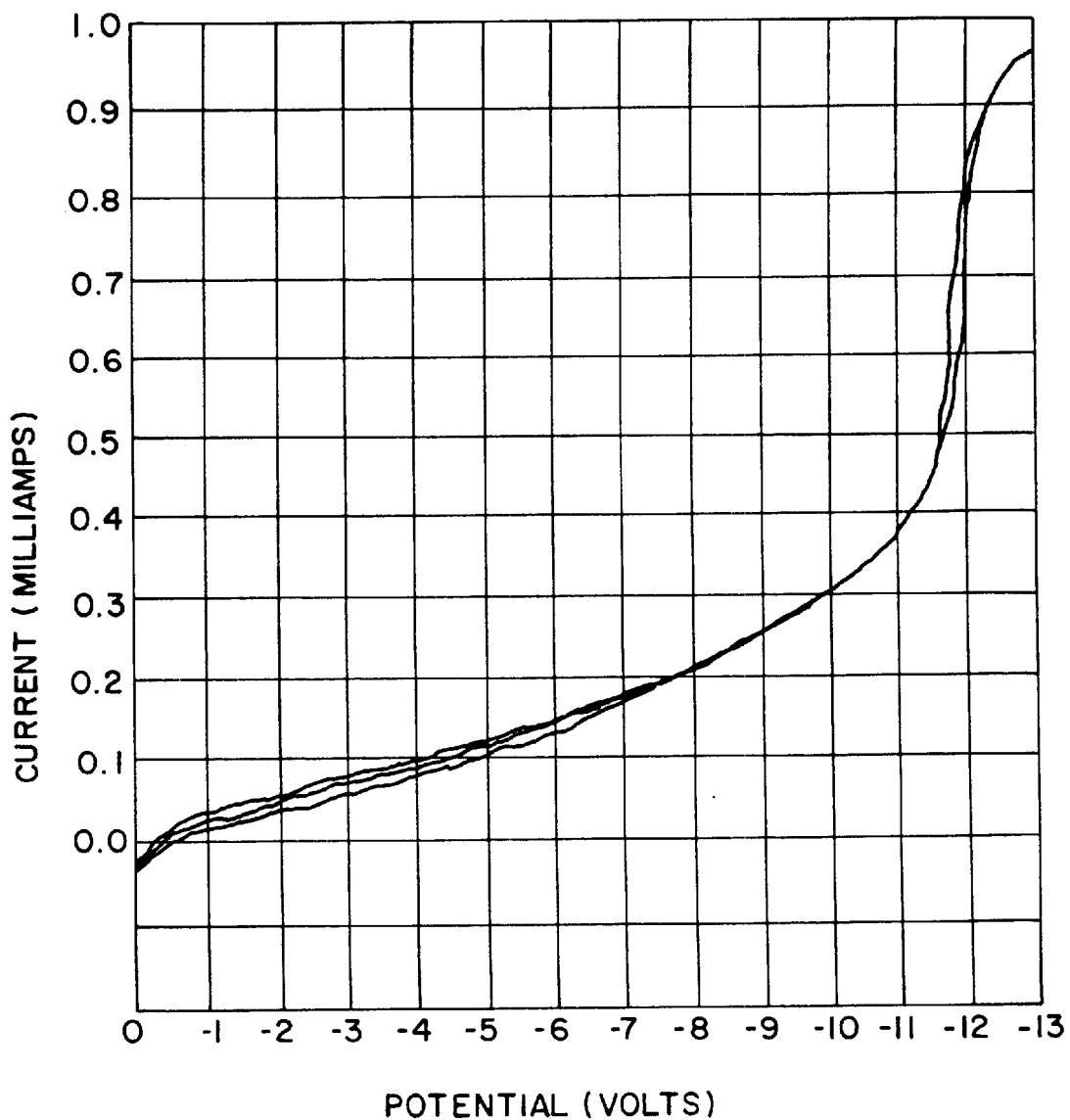
FIG. 44 illustrates the repeatability of measurements of the break down voltage of an end-channel diode made using the probe assembly of FIGS. 19 through 35.

FIG. 44 illustrates the results of a test designed to identify where an N-channel diode breaks down and begins to conduct current The similar shape of the three curves associated with three such measurements indicates the repeatability of the measurement, and the lack of significant oscillations demonstrates that there are no appreciable leakage currents at the measurement point using the probe assembly of the invention.

Thus, the unique design of the probe assembly of the invention has been shown to be ideally suited for making accurate low current and low voltage measurements of semi-conductor integrated circuit wafers and other electronic components.

While the foregoing described embodiments have been set forth above, it will be appreciated to one skilled in the art that the inventions described have applications beyond the described embodiments. Accordingly, it is intended that the scope of the invention including such alternatives, modifications, and variations contemplated shall be defined by the appended claims.

What is claimed is:

1. A probe assembly for a probe station for inspecting a device under test, comprising:
   a probe holder adapted to be connected to a positioning device for positioning the probe holder relative to the device under test, said probe holder comprising an elongated first conductive member and a second conductive member extending about said first conductive member and electrically isolated therefrom;
   a probe cartridge comprising an elongated conductive probe having a probe tip for contacting said device under test and a middle conductive member extending about at least a portion of said conductive probe and electrically isolated therefrom; and
   a detachable connection between said probe holder and said probe cartridge that provides a sliding fit therebetween such that when connected said first conductive member of said probe holder mates with said elongated conductive probe, and said second conductive member of said probe holder mates with said middle conductive member of said probe cartridge.

2. A probe assembly as recited in claim 1, wherein the middle conductive member of said probe cartridge extends to within less than 0.5 inches of the end of said probe tip.

3. A probe assembly as recited in claim 1, wherein the middle conductive member of said probe cartridge extends to within less than 0.1 inches of the end of said probe tip.

4. A probe assembly as recited in claim 1, wherein said first and second conductive members of said probe holder are adapted for coupling to electric potentials.

5. A probe assembly as recited in claim 4, wherein said middle conductive member of said probe cartridge forms an electrical barrier to guard said conductive probe.

6. A probe assembly as recited in claim 4, wherein said middle conductive member of said probe cartridge is raised to substantially the same electric potential as said conductive probe to reduce the effects of capacitance and noise at said device under test.

7. A probe assembly as recited in claim 1, wherein said conductive probe slidably frictionally engages said first conductive member of said probe holder.

8. A probe assembly as recited in claim 1, wherein said middle conductive member of said probe cartridge slidably frictionally engages said second conductive member of said probe holder.

9. A probe assembly as recited in claim 8, wherein said middle conductive member of said probe cartridge and said second conductive member of said probe holder have non-circular cross-sections.

10. A probe assembly as recited in claim 1, wherein said probe holder further comprises a third conductive member extending about at least a portion of said second conductive member and electrically isolated therefrom.

11. A probe assembly as recited in claim 10, wherein said first, second and third conductive members of said probe holder are adapted for coupling to electric potentials.

12. A probe assembly as recited in claim 10, wherein said probe cartridge further comprises an outer conductive member extending about at least a portion of said middle conductive member and electrically isolated therefrom adopted to mate with said third conductive member of said probe holder when said probe cartridge is connected to said probe holder.

13. A probe assembly as recited in claim 10, wherein said third conductive member extends about at least a portion of said middle conductive member of said probe cartridge when said probe cartridge is connected to said probe holder.

14. A probe station for inspecting a device under test, comprising:
    a frame having opposite vertically disposed supports,
    a horizontally extending platen supported on said frame,
    a chuck apparatus for supporting the device under test positioned within said frame,
    a positioning mechanism supported on said platen for positioning a probe assembly;
    said probe assembly further comprising:
       a probe holder adapted to be connected to a positioning device for positioning the probe holder relative to the device under test, said probe holder comprising an elongated first conductive member and a second conductive member extending about said first conductive member and electrically isolated therefrom;
       a probe cartridge comprising an elongated conductive probe having a probe tip for contacting said device under test and a middle conductive member extending about at least a portion of said conductive probe and electrically isolated therefrom; and
       a detachable connection between said probe holder and said probe cartridge that provides a sliding fit therebetween such that when connected said first conductive member of said probe holder mates with said elongated conductive probe, and said second conductive member of said probe holder mates with said middle conductive member of said probe cartridge.

15. A probe station as recited in claim 14, wherein the middle conductive member of said probe cartridge extends to within less than 0.5 inches of the end of said probe tip.

16. A probe station as recited in claim 14, wherein the middle conductive member of said probe cartridge extends to within less than 0.1 inches of the end of said probe tip.

17. A probe station as recited in claim 14, wherein said first and second conductive members of said probe holder are adapted for coupling to electric potentials.

18. A probe station as recited in claim 17, wherein said middle conductive member of said probe cartridge is raised to substantially the same electric potential as said conductive probe to reduce the effects of capacitance and noise at said device under test.

19. A probe station as recited in claim 14, wherein said probe holder further comprises a third conductive member extending about at least a portion of said second conductive member and electrically isolated therefrom.

20. A probe station as recited in claim 19, wherein said first, second and third conductive members of said probe holder are adapted for coupling to electric potentials.

21. A probe station as recited in claim 19, wherein said probe cartridge further comprises an outer conductive member extending about at least a portion of said middle conductive member and electrically isolated therefrom adopted to mate with said third conductive member of said probe holder when said probe cartridge is connected to said probe holder.

22. A probe station as recited in claim 19, wherein said third conductive member extends about at least a portion of said middle conductive member of said probe cartridge when said probe cartridge is connected to said probe holder.

23. A probe station for inspecting a device under test, comprising:
   a frame having opposite vertically disposed supports,
   a horizontally extending platen supported on said frame,
   a chuck apparatus for supporting the device under test positioned within said frame,
   a positioning mechanism supported on said platen for positioning a probe assembly;
   said probe assembly further comprising:
      a probe holder adapted to be connected to a positioning device for positioning the probe holder relative to the device under test, said probe holder comprising an elongated first conductive member and a second conductive member extending about said first conductive member and electrically isolated therefrom;
      a probe cartridge comprising an elongated conductive probe having a probe tip for contacting said device under test and a middle conductive member extending about at least a portion of said conductive probe and electrically isolated therefrom; and
      a detachable connection between said probe holder and said probe cartridge, such that when connecting said first conductive member of said probe holder mates with said elongated conductive probe, and said second conductive member of said probe holder mates with said middle conductive member of said probe cartridge;
   said chuck apparatus further comprising:
      a laterally extending electrical insulator having an upper surface;
      a first conductive member disposed on the upper surface of said insulator for supporting a wafer device under test, said insulator supported on a second conductive member, the outer edge of the first conductive member being spaced from the outer edge of the insulator;
      a third conductive member isolated from and spaced below said second conductive member; and
      an electrically isolated fourth conductive member disposed on the upper surface of said insulator in spaced relation to the outer edge of said first conductive member.

* * * * *